United States Patent

[19]

Riemer et al.

[11] Patent Number: 5,886,671
[45] Date of Patent: *Mar. 23, 1999

[54] LOW-COST COMMUNICATION PHASED-ARRAY ANTENNA

[75] Inventors: Dietrich E. Riemer, Bellevue; Donn T. Harvey; Jay H. McCandless, both of Issaquah; George W. Fitzsimmons, Kent, all of Wash.

[73] Assignee: The Boeing Company, Seattle, Wash.

[ * ] Notice: This patent issued on a continued prosecution application filed under 37 CFR 1.53(d), and is subject to the twenty year patent term provisions of 35 U.S.C. 154(a)(2).

[21] Appl. No.: 576,020

[22] Filed: Dec. 21, 1995

[51] Int. Cl.$^6$ ..................................................... H01Q 13/00
[52] U.S. Cl. .......................... 343/776; 343/778; 343/853; 342/368
[58] Field of Search ............................. 343/700 MS, 768, 343/785, 701, 824, 771, 772, 776, 778, 853; 342/368; 333/113, 114, 125

[56] References Cited

U.S. PATENT DOCUMENTS

| | | | |
|---|---|---|---|
| 4,021,813 | 5/1977 | Black et al. | 343/768 |
| 4,771,294 | 9/1988 | Wasilousky . | |
| 4,939,527 | 7/1990 | Lamberty et al. . | |
| 4,952,894 | 8/1990 | Connerney et al. . | |
| 5,019,829 | 5/1991 | Heckman et al. . | |
| 5,083,132 | 1/1992 | Kanda et al. | 343/701 |
| 5,109,232 | 4/1992 | Monte | 343/785 |
| 5,162,803 | 11/1992 | Chen . | |
| 5,276,455 | 1/1994 | Fitzsimmons et al. . | |

FOREIGN PATENT DOCUMENTS

| | | |
|---|---|---|
| 0 620 613 A2 | 4/1994 | European Pat. Off. . |
| 0 621 654 A2 | 4/1994 | European Pat. Off. . |
| 0 665 607 A1 | 1/1995 | European Pat. Off. . |
| 08/06351 | 8/1988 | WIPO . |

OTHER PUBLICATIONS

*Integrated T/R modules employ GaAs Ics,* by R.S. Pengelly; Microwaves & RF, Feb. 1985.
*Monolithic Phased Arrays for EHF Communications Terminals,* by John F. McIlvenna; Microwave Journal, Mar. 1988.

(List continued on next page.)

*Primary Examiner*—Don Wong
*Assistant Examiner*—Tho Phan
*Attorney, Agent, or Firm*—Christensen O'Connor Johnson Kindness PLLC

[57] ABSTRACT

A phased-array antenna structure is provided that includes an antenna waveguide structure with a plurality of waveguides. The antenna waveguide structure propagates the received or transmitted electromagnetic (EM) signals within the plurality of waveguides to a corresponding active array module. Each active array module amplifies and adjusts the phase of a received or transmitted EM signal. The active array modules are coupled to an interconnect structure that provides EM signal propagation paths, as well as power and digital signal paths, to and from the active array modules. A plate is coupled to the interconnect structure and the antenna waveguide structure to support the antenna waveguide structure, the electronic modules, and the interconnect structure, thereby forming a rigid unit and keeping the electronic modules in alignment with their corresponding waveguides in the antenna waveguide structure. The plate also includes waveguides for propagating the EM signals from the interconnect structure to the antenna output. The active array modules each include an integrated polarizer for selectably operating with either right-hand circularly polarized signals or left-hand polarized signals. The polarizer, amplifiers and phase shifters are mounted on a substrate in each active array module, with the substrate disposed in a position normal to the propagation of the EM signals in the corresponding waveguide of the antenna waveguide structure, resulting in a planar configuration. Further, each active array module includes a waveguide as an integral part of the active array module.

57 Claims, 21 Drawing Sheets

OTHER PUBLICATIONS

*Boeing Satellite Television Airplane Receiving System (STARS) Performance,* by Edward J. Vertatschitsch and George W. Fitzsimmons; presented at International Mobile Satellite Conference, Jun. 1995.

K.A. Shalkhauser et al., "Multi–Element Multi–Layered Packaging for Phased Array Antenna Applications," *Institute of Electrical and Electronics Engineers,* 28, pp. 1009–1012, (1993).

T. Razban et al., "Weather Forecasting Radar Antenna: An Application of Active Microstrip Antennas," *Microwave Exhibitions and Publishers,* 2, pp. 888–893 (1992).

R.J. Mallows, "Antenna Array Architecture," *Proceedings of the IEEE,* 80, pp. 163–172 (1992).

Mailloux Newberg et al., "Revolutionary Active Array Radar Using Solid State 'Modules' and Fiber Optics," *Record of the 1993 IEEE National Radar Conference,* pp. 88–92, (1993).

B.J. Lamberty et al., "Waveguide Distribution Networks for EHF Phased Array Antennas ",*Proceedings of the 1992 Antenna Applications Symposium,* (22 pages, Sep. 23, 24, 25,1992).

George W. Fitzsimmons et al., "A Connectorless Module for an EHF Phased–Array Antenna", *Microwave Journal,* (6 pages, Jan. 1994).

Dietrich E. Riemer, "Packaging Design of Wide–Angle Phased–Array Antenna for Frequencies Above 20 GHz", *IEEE Transactions on Antennas and Propagation,* (vol. 43, No. 9, 6 pages, Sep. 1995).

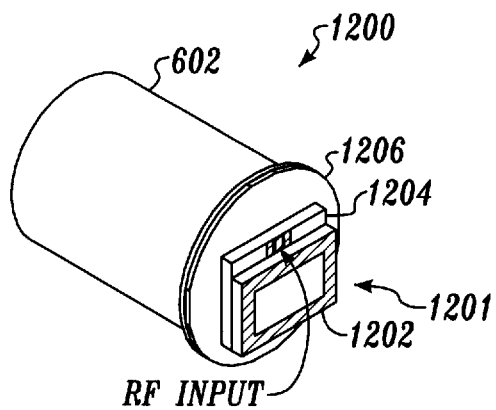
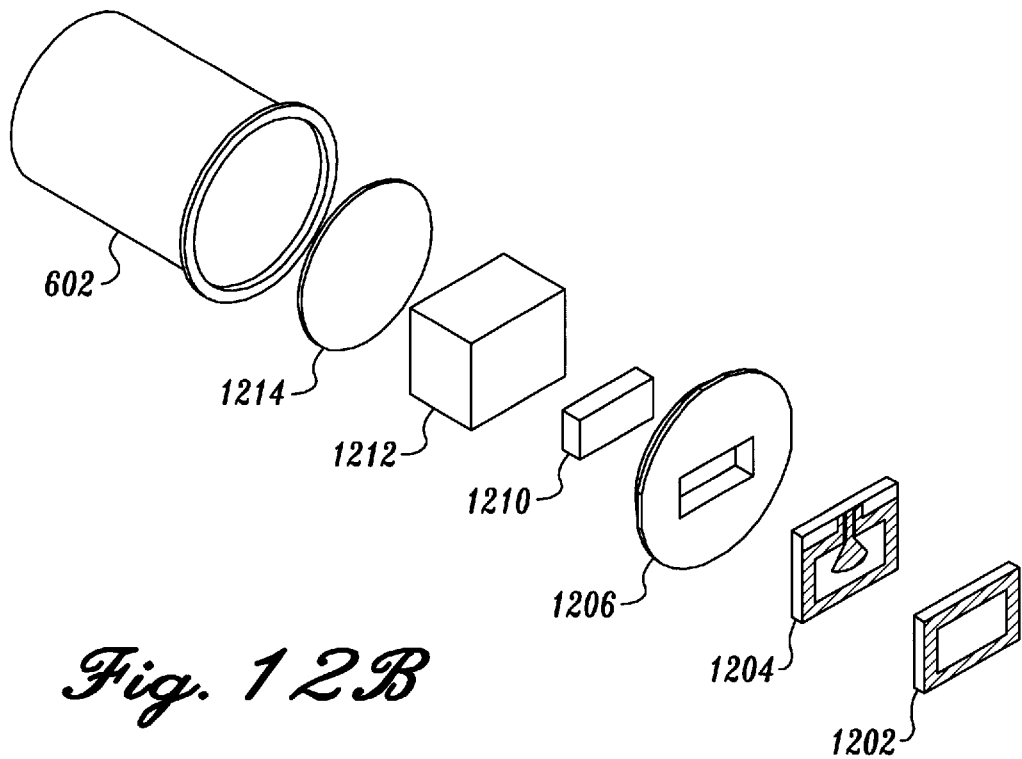

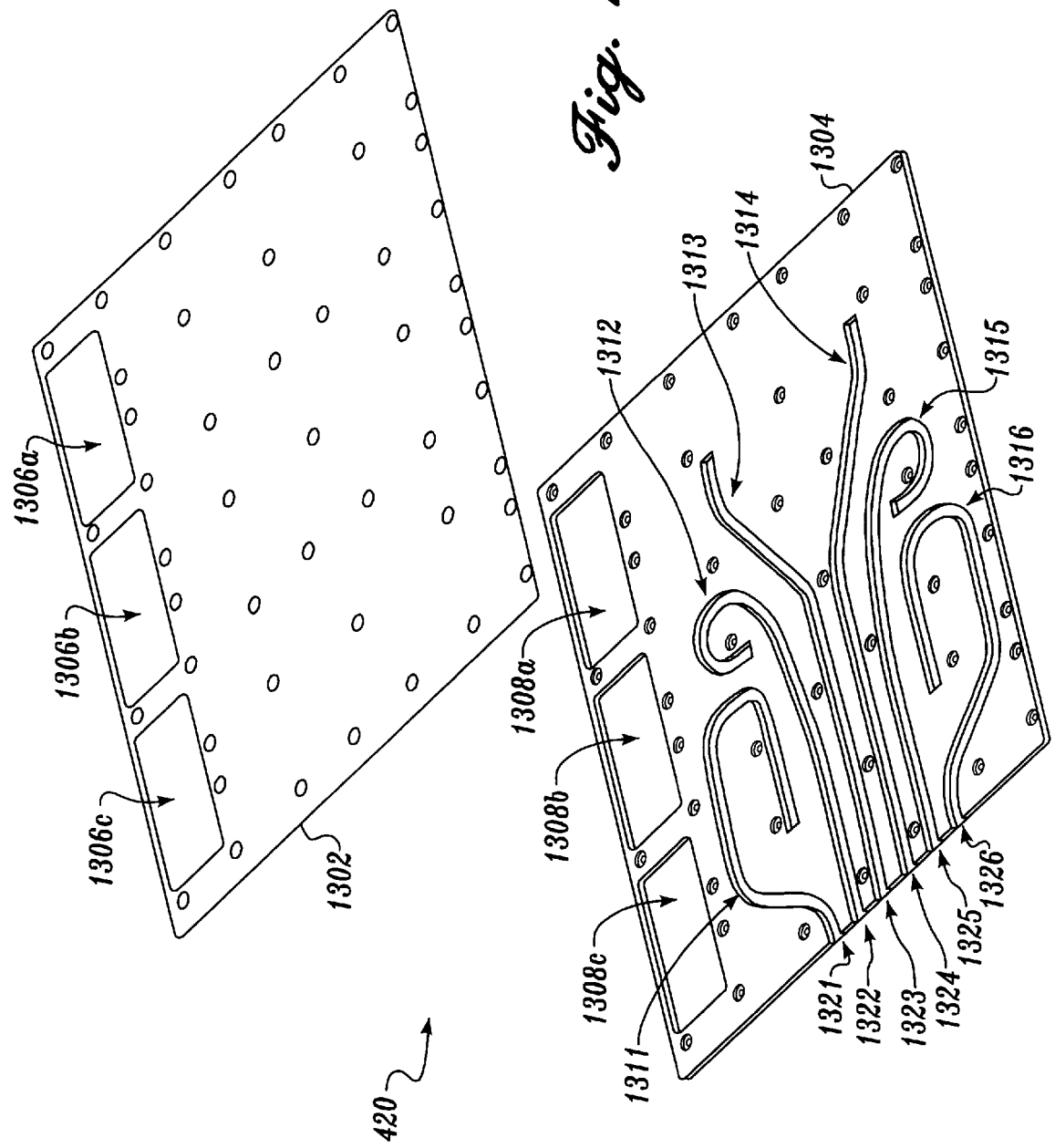

LOW-COST COMMUNICATION PHASED-ARRAY ANTENNA

FIELD OF THE INVENTION

The present invention is related to phased-array antennas and, more particularly, to low-cost active-array antennas for use with high-frequency communication systems.

BACKGROUND OF THE INVENTION

A typical conventional phased-array antenna has an arrangement of radiating elements where the relative phase of radio frequency (RF) waves propagated through each radiating element can be controlled to steer the "beam" of the antenna's radiation pattern. In one type of phased-array antenna, known as active arrays, each radiating element has associated electronics that include amplifiers and phase shifters. The distributed nature of the active array architecture offers advantages in, for example, power management, reliability, system performance and signal reception and/or transmission. However, the electronics associated with the radiating elements typically cause an active array antenna to be much thicker than a passive array antenna. In some applications, such as, for example, airborne externally mounted arrays, the thick antennas are impractical.

One example of an active array is disclosed in U.S. Pat. No. 5,276,455 (hereinafter "the '455 patent") issued to Fitzsimmons, et al., Jan. 4, 1994, assigned to the same assignee as the present invention and incorporated herein by reference in its entirety. FIG. 7 of the '455 patent, reproduced in the drawings of this application as FIG. 1, is an exploded view of an active array antenna 100 disclosed in the '455 patent for use in receiving or transmitting circularly polarized RF signals. Antenna 100 has an antenna honeycomb 132, a module honeycomb 128 and a feed honeycomb 134, each having a plurality of waveguides aligned with a corresponding waveguide in the other honeycombs. Each waveguide of honeycomb 132 contains a dielectric 146 and separate polarizer 148. Each waveguide of honeycomb 128 contains an "in-line" active array module 130 (i.e., the substrate of each module 130 is parallel or "in-line" with the direction of the received or transmitted RF signal propagation), and each waveguide of honeycomb 134 contains a dielectric 146.

Further, antenna 100 has a waveguide feed network 112 for propagating RF signals to or from feed honeycomb 134, and multilayer wiring boards 140a and 140b for distributing power and logic signals to modules 130. Multilayer wiring boards 140a and 140b do not propagate the RF signals transmitted or received by antenna 100. Rather, modules 130 perform waveguide-to-waveguide transmission of the received and transmitted RF signals via antenna honeycomb 132 and feed honeycomb 134.

Compared to other existing phased-array architectures, the phased-array of the '455 patent offers improvements in size, thickness, cost, maintainability, reliability, testability, and assembly. But, of course, improvements are generally always desirable. Antenna 100 is still relatively thick because of honeycombs 128, 132 and 134 and the "in-line" configuration of modules 130 and separate polarizers 148. Further, because moisture in hollow waveguide may detrimentally affect the antenna's performance, arrays that employ hollow waveguides generally require pressurization with a dry gas to reduce moisture build up, thereby increasing complexity of the antenna.

In addition, modules 130 have extension substrates for input and output couplers for inputting and outputting RF signals to or from antenna honeycomb 132 and feed honeycomb 134, as well as a carrier substrate for supporting and interconnecting monolithic microwave integrated circuits (MMICs) for amplifying and phase shifting the received or transmitted RF signals. The extension substrates are bonded to the carrier substrate, which are then covered and sealed. The complexity, assembly and yield cost cause such modules 130 to be relatively expensive to fabricate. Even though the individual cost of each electronic module 130 is modest, the large number of modules required to assemble an array represents the largest antenna cost component.

SUMMARY OF THE INVENTION

The present invention provides a phased-array antenna structure. In one embodiment, the phased-array antenna structure includes an antenna waveguide structure with a plurality of waveguides. The antenna waveguide structure propagates the received or transmitted electromagnetic (EM) signals within the plurality of waveguides to a corresponding electronic module. Each electronic module adjusts at least the phase of a received or transmitted EM signal. The electronic modules are coupled to a multilayer wiring board that provides EM signal propagation paths to and from the electronic modules. A pressure plate is attached to the multilayer wiring board and the antenna waveguide structure to support the antenna waveguide structure, the electronic modules, and the multilayer wiring board to form a substantially rigid unit and keep the electronic modules in alignment with their corresponding waveguide in the antenna waveguide structure. As a result, this embodiment can be much thinner than other active arrays, due in part because a single waveguide structure is used instead of the three honeycombs used in some other active arrays.

In another embodiment of the present invention, the electronic modules each include first and second EM signal probes. The signal probes are coupled to separate amplifiers, which are then coupled to an integrated polarizer. The integrated polarizer eliminates the need for a separate polarizer to receive or transmit circularly polarized EM signals and reduces the insertion loss compared to separate polarizer systems. In a further refinement, the integrated polarizer contains a polarity switch which can be selectably configured to receive right-hand circularly polarized signals or left-hand circularly polarized signals. As is known in the art of active phased-array antennas, by reciprocity the design may be reversed for transmission of left-hand or right-hand circularly polarized signals.

In another embodiment, each electronic module includes a phase shifter mounted on a substrate. The substrate is normal to the propagation of the EM signals in the corresponding waveguide of the antenna waveguide structure, resulting in a planar configuration. The planar configuration of the electronic modules allows the antenna to be thinner than the in-line modules used in other antennas and, in addition, allows each EM signal probe to be connected to its corresponding amplifier without the use of striplines, finlines or slotlines that are used in some conventional phased-array antennas, thereby reducing the complexity of the metallization of the substrate and further reducing signal loss.

In still another embodiment, each electronic module includes a waveguide. This integrated waveguide structure of the electronic module provides protection for the module electronics from large fields caused, for example, by lightning strikes. Further, the integrated waveguide structure includes an integral dielectric fill. The integral dielectric fill seals the waveguide from moisture. Thus, the integral dielectric fill reduces the dependence on a dry atmosphere within the array to avoid moisture buildup and produces a robust reliable electronic module.

BRIEF DESCRIPTION OF THE DRAWINGS

The foregoing aspects and many of the attendant advantages of this invention will become more readily appreciated as the same becomes better understood by reference to the following detailed description, when taken in conjunction with the accompanying drawings, wherein:

FIGS. 6A–6E, respectively, are an antenna-end perspective of one embodiment of an electronic module of the present invention, a circuit-end perspective of the electronic module, an exploded perspective of one embodiment of a semiconductor package, an exploded perspective of the electronic module, and a top plan of one embodiment of a semiconductor package of the electronic module;

FIGS. 12A and 12B, respectively, are an assembled and exploded perspective of a stripline to waveguide transition module according to one embodiment of the present invention;

FIG. 13 is an exploded perspective of a pressure plate according to one embodiment of the present invention;

DETAILED DESCRIPTION OF THE PREFERRED EMBODIMENT

Figure 2:
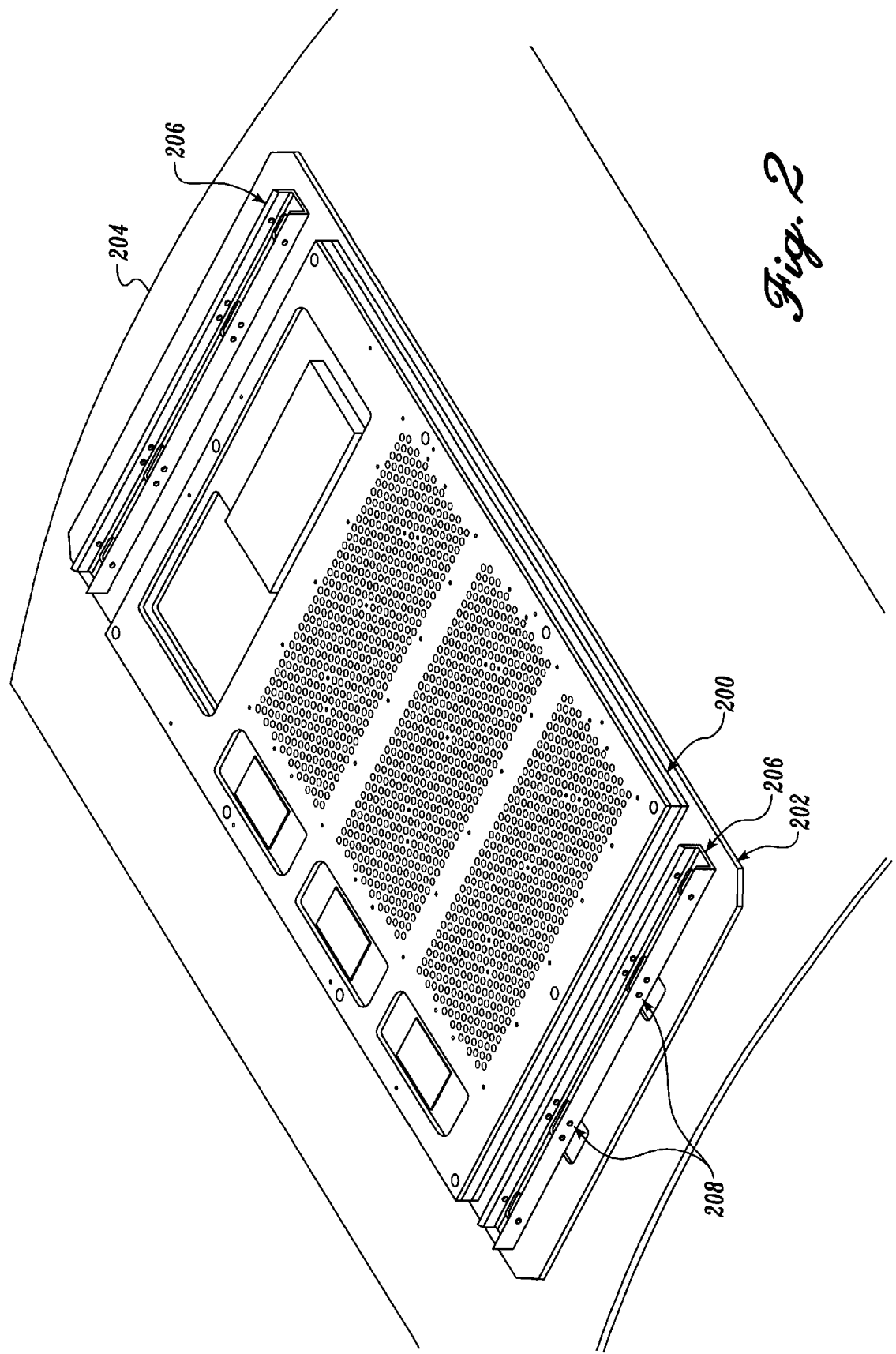
FIG. 2 is a top perspective of a phased-array antenna according to one embodiment of the present invention.

FIG. 2 shows a perspective view of a phased-array antenna 200 according to one embodiment of the present invention, adapted for use with an aircraft. Antenna 200 is shown mounted to an adapter plate 202, which, in turn, is used to mount antenna 200 to the aircraft external to skin 204. A wide angle impedance matching (WAIM) structure (not shown) is typically fixed onto antenna 200 to cover it. Adapter plate 202 includes two mounting brackets 206, which are attached near the ends of adapter plate 202. Mounting brackets 206 include mounting structures 208 through which adapter plate 202 may be attached to aircraft skin 204. In this embodiment, mounting structures 208 are holes in which adapter plate 202 is bolted to mounting structures (not shown) welded on aircraft skin 204 and fitted through cutouts 210 in adapter plate 202. Of course, in other embodiments, any suitable means may be used to attach adapter plate 202 to aircraft skin 204.

Because antenna 200 is mounted to aircraft skin 204, it is desirable that antenna 200 be as thin as possible to reduce aerodynamic drag. Further, cutting aircraft skin 204 so that antenna 200 may be embedded or recessed is impractical because cuts weaken aircraft skin 204 and greatly reduce the structural integrity of the aircraft. In addition, the cost of a recessed mounting is likely to be prohibitive for after-market aircraft. Some new aircraft are provided with antenna attachment hardware which connects to adapter plate 202

Figure 3A:
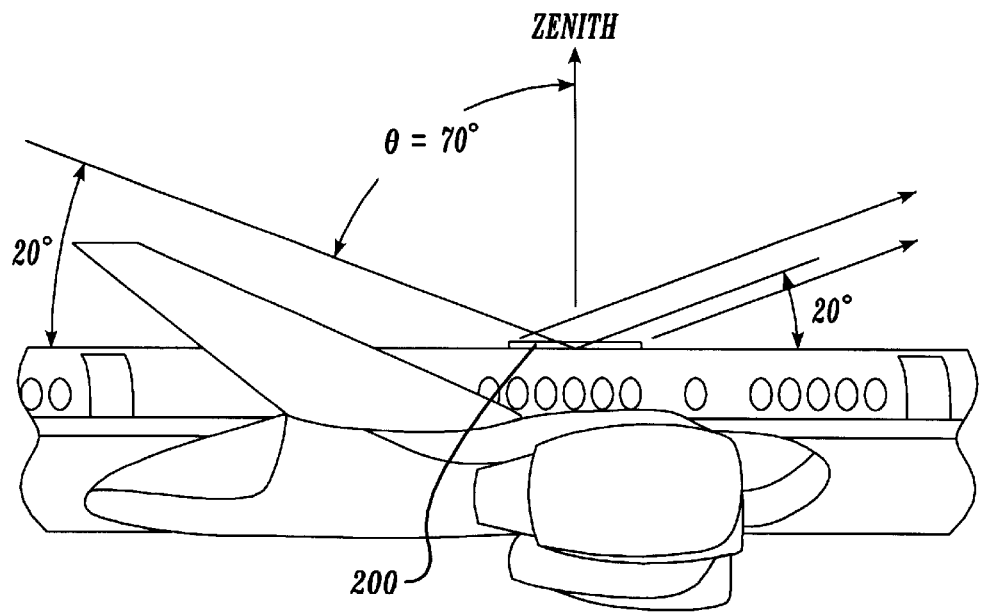
FIGS. 3A and 3B, respectively, are a diagrammatic side elevation and vertical section of a phased-array antenna according to the present invention mounted on an aircraft.

FIG. 3A shows a side elevation of antenna 200 mounted on an aircraft. In this embodiment, antenna 200 is intended to be used for receiving signals from the direct broadcast satellite (DBS) service. Although antenna 200 is a receive antenna, in light of the description provided herein, antenna 200 can be easily modified into a transmit antenna or transmit-receive antenna by those skilled in the art of phased-array antennas without undue experimentation. The DBS service provides digital television signals modulated using quadrature phase shift keying (QPSK) format on an EM wave that is circularly polarized. The DBS signals are currently broadcast worldwide between approximately 11.7–12.7 GHz. Although a phased-array antenna structure for use with DBS signals is disclosed, it is appreciated that the disclosed antenna structure can be modified for use in other frequencies in the range of 6–26 GHz by those skilled in the art of active phased-array antennas using current MMIC technology without undue experimentation.

For aircraft flying above the continental United States, the DBS satellites may be at an angle of up to approximately 60° from zenith. As shown in FIG. 3A, antenna 200 must be able to scan at angles up to approximately 70° (from zenith) to receive the DBS signals from the DBS satellites and allow for a 10° roll by the aircraft.

Figure 3B:
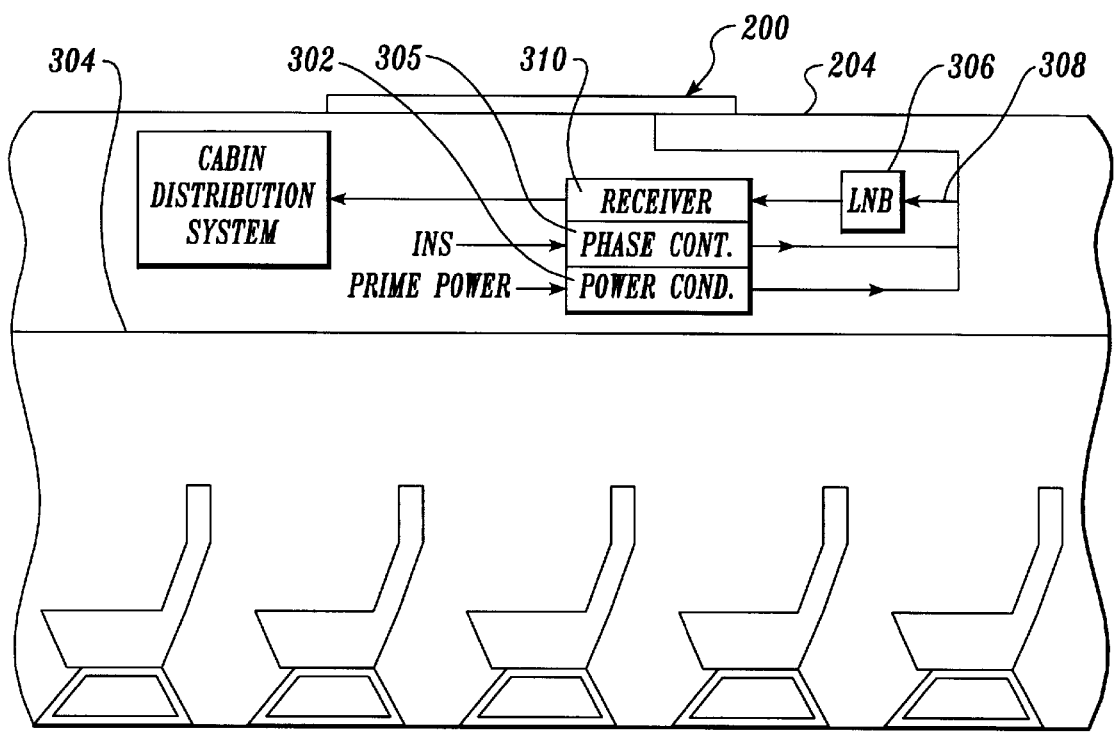

FIG. 3B shows antenna 200 mounted on aircraft skin 204 with other parts of the DBS receive system shown diagrammatically. In this embodiment, antenna 200 receives power from a power conditioner 302 located between aircraft skin 204 and the cabin liner 304. Antenna 200 also receives control signals (e.g., phase control signals to steer the beam of antenna 200) from a controller 305.

Antenna 200 routes received DBS signals to a conventional low noise block down converter (LNB) 306 through a flexible coaxial cable 308. LNB 306 converts the approximately 12 GHz DBS signals to intermediate frequency signals of approximately 950–1450 MHz. LNB 306 then provides the intermediate signals to a conventional receiver 310 that extracts the digital video signals, performs error correction on the digital video signals, and converts the digital video signals to analog video signals.

Figure 4A:
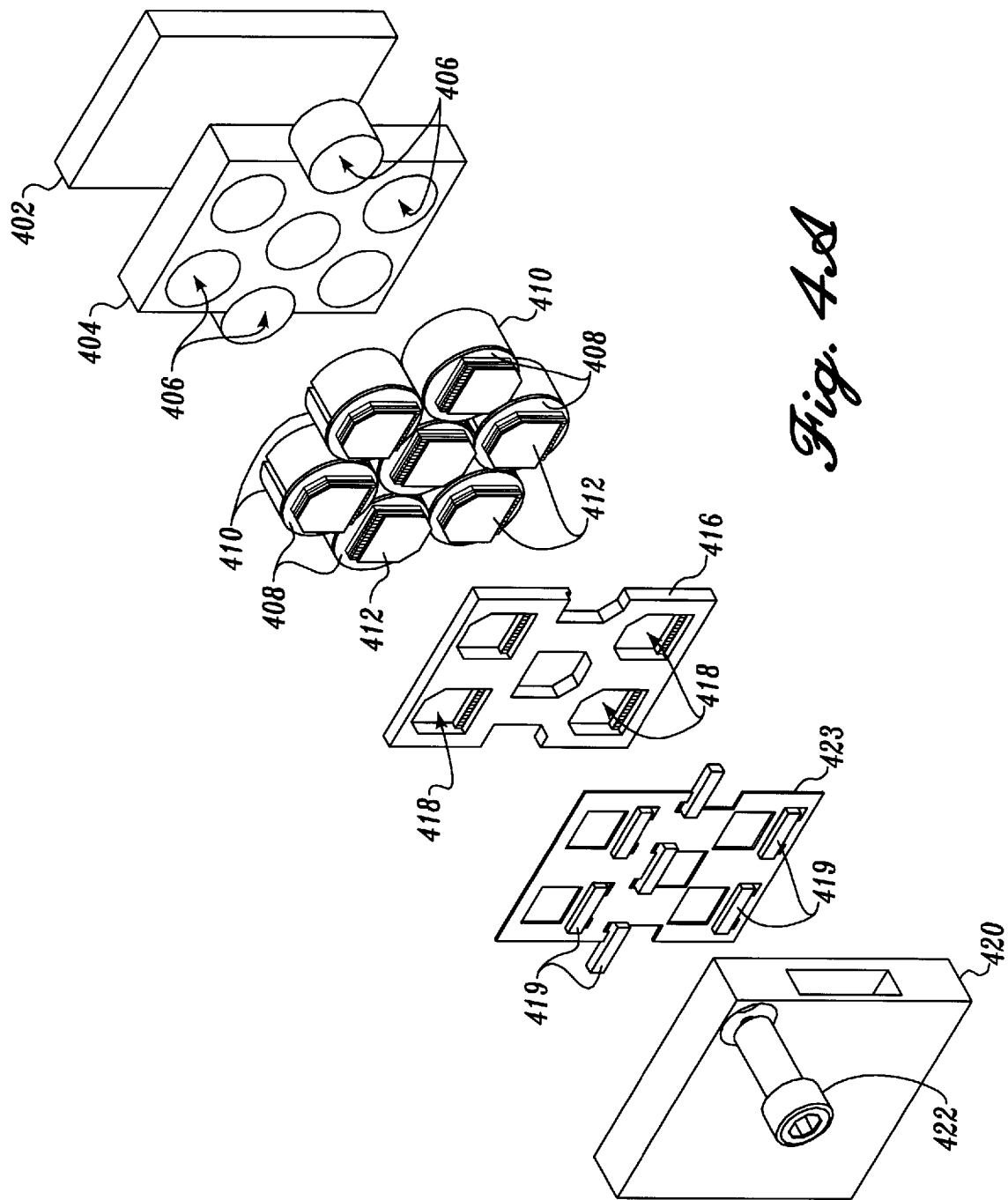
FIGS. 4A–4C, respectively, are an exploded perspective of a portion of one embodiment of a phased-array antenna, an exploded perspective of another embodiment of a phased-array antenna, and a top plan of a phased-array antenna, according to the present invention.

FIG. 4A shows an exploded perspective of a portion of antenna 200 according to one embodiment of the present invention. Antenna 200 includes a wide angle impedance matching (WAIM) structure 402, which serves as a cover for the antenna. WAIMs are well known in the art of phased-array antennas.

Antenna 200 also includes an antenna honeycomb 404 with a plurality of circular waveguides 406. Waveguides 406 may be loaded with a suitable dielectric, such as, for example, cross-linked polystyrene, which is available as Rexolite®. Antenna honeycomb 404 is made from a metal plate, such as, for example, aluminum (with a suitable coating to reduce corrosion), with waveguides 406 machined into the metal plate. Antenna honeycomb 404 serves as a waveguide structure and need not resemble a honeycomb.

Antenna 200 also includes a plurality of electronic modules 408 aligned with waveguides 406 of antenna honeycomb 404. In this embodiment, electronic modules 408 are not inserted into waveguides 406. Instead, each electronic module 408 is surrounded by a sleeve 410 and is placed in operative position adjacent to a corresponding circular waveguide 406 in antenna honeycomb 404, whereby electronic modules 408 receive DBS signals through waveguides 406.

In this embodiment, each electronic module 408 includes a sleeve 410 coupled around a circular waveguide (described below in conjunction with FIGS. 6A and 6B). The associated circular waveguide of each electronic module 408 is at one end of the electronic module and is placed in contact with antenna honeycomb 404 and aligned with a corresponding waveguide 406. Sleeves 410 facilitate the EM coupling between receiving waveguides 406 and the circular waveguides of electronic modules 408. Each Sleeve 410 also serves to thicken the corresponding electronic module's waveguide wall to form a waveguide butt connection to the corresponding waveguide 406 of antenna honeycomb 404. Although sleeves are described in this embodiment of electronic modules 408, other retaining devices, such as, for example, springs or clips can be used in other embodiments.

Each electronic module 408 also includes a semiconductor package 412 on the opposite end of the module that is keyed. Each semiconductor package 412 also includes a polarity switch, amplifiers, phase shifters and a logic circuit (described further below in conjunction with FIGS. 5–7B). The semiconductor package of each electronic module amplifies, combines (i.e., combines the linearly polarized component signals of the received circularly polarized DBS signal), and phase shifts received DBS signals, which it then outputs as an RF output signal.

A multilayer wiring board 416 has keyed cutouts or openings 418 in multilayer wiring board 416 shaped and positioned to receive the keyed semiconductor packages 412 of electronic modules 408 so that the electronic modules 408 are aligned with the corresponding waveguides 406 of antenna honeycomb 404. Sleeves 410 of electronic modules 408 accommodate misalignment and slight length differences of electronic modules 408 and provide contact area with waveguides 406 of antenna honeycomb 404. The inclusion of multilayer wiring board 416 eliminates the need for a more costly module honeycomb as is required in some other phased-array antennas.

Multilayer wiring board 416 serves as an interconnect structure providing conductive paths between the modules and the power conditioner 302 (FIG. 3B). Multilayer wiring board 416 also includes conductive traces for carrying control signals for controlling the phase shifters of electronic modules 408.

Moreover, in this embodiment, multilayer wiring board 416 also includes striplines (described further below in conjunction with FIG. 8A) for propagating the RF DBS signals, as well as conductors for the control signals from controller 305 (FIG. 3B) and power from power conditioner 302 (FIG. 3B). More specifically, multilayer wiring board 416 includes a stripline routed to each opening 418 for propagating the RF output signal from each electronic module 408. The striplines corresponding to a group of electronic modules are combined using power combiners in multilayer wiring board 416 (described further below in conjunction with FIG. 8A). Elastomeric connectors 419 electrically connect electronic modules 408 to multilayer wiring board 416 for power, logic and RF signals. Multilayer wiring board 416 is described further below in conjunction with FIGS. 8A and 8B, and elastomeric connectors 419 are described in conjunction with FIGS. 10A–10C.

A pressure plate 420 is attached to antenna honeycomb 404 with fasteners 422. Fasteners 422 can be, for example, screws, bolts, clamps, latches or any suitable type of fastener that can securely fasten pressure plate 420 to antenna honeycomb 404 and yet be easily removed. In this embodiment, fasteners 422 are bolts. Fasteners 422 are tightened so that pressure plate 420, together with support shim 423, compress elastomeric connectors 419 against connector contacts of multilayer wiring board 416 and semiconductor package 412 of electronic modules 408, thereby providing good electrical contact between multilayer wiring board 416 and electronic modules 408 without soldering. The solderless elastomeric connectors 419 facilitate assembly, maintenance and replacement. Further, using solderless connectors avoids failures during assembly induced by full board high temperature solder operations. In addition, solderless connectors increase reliability by eliminating relatively inflexible solder connections of conventional systems, which are sensitive to temperature cycling and vibration. Together with sleeves 410 and the keying in multilayer wiring board 416, the compressive force of fasteners 422 on pressure plate 420 and antenna honeycomb 404 help keep electronic modules 408 aligned with waveguides 406.

Figure 4B:
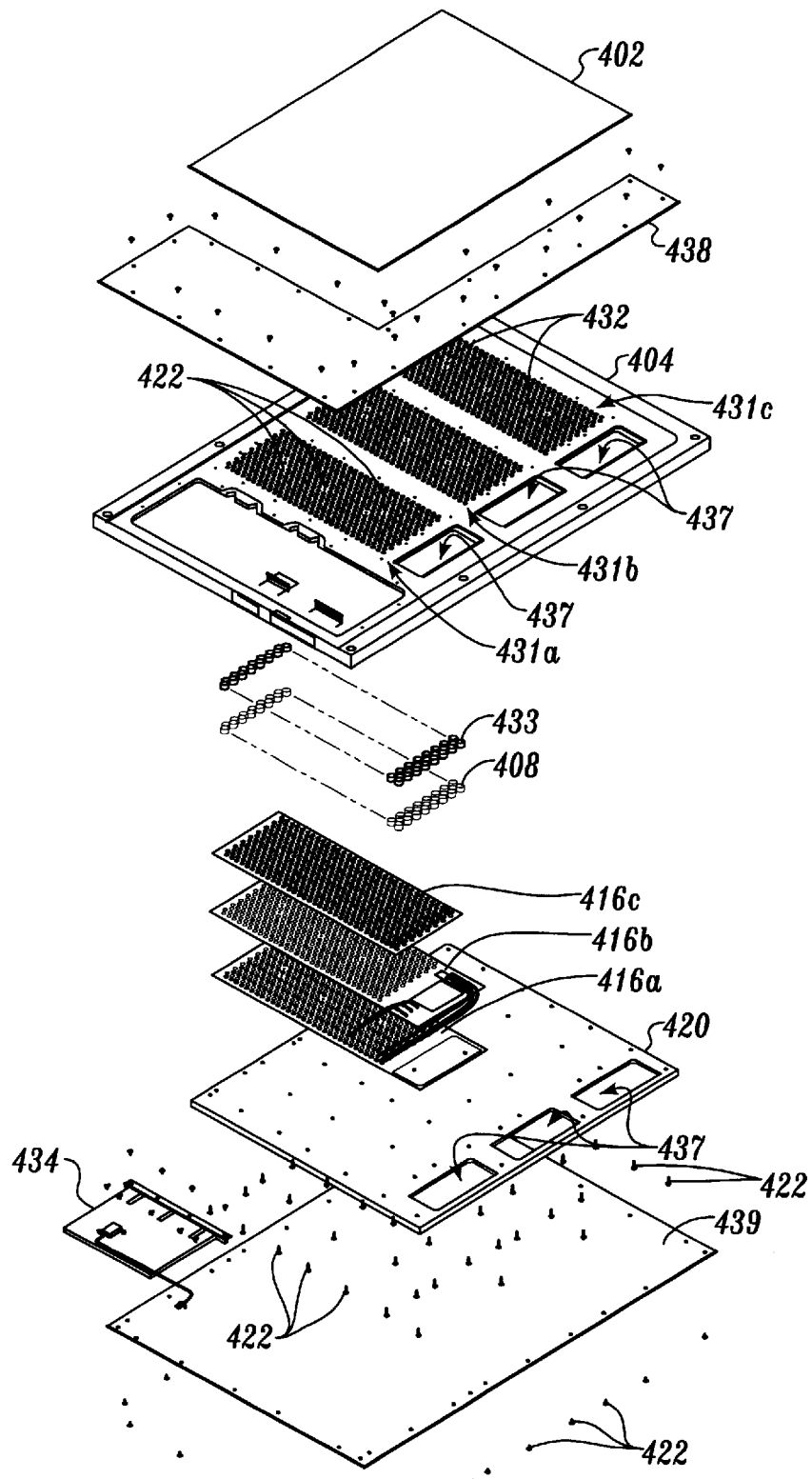

FIG. 4B is an exploded perspective of another embodiment of antenna 200, drawn on a much smaller scale. Antenna honeycomb 404 includes three sections 431A–431C of circular waveguides 406. Each section has 507 waveguides, and spaces for three fasteners 422 and two stripline-to-waveguide couplers 432 (described below in conjunction with FIGS. 11A and 11B). Electronic modules 408 are disposed below antenna honeycomb 404. Multilayer wiring board 416 has three coplanar sections 416A–416C corresponding to sections 431A–431C of antenna honeycomb 404 disposed below electronic modules 408. In other embodiments, the three coplanar sections of multilayer wiring board 416 can be incorporated into a single multilayer wiring board. Electronic modules 408 are coupled to multilayer wiring board 416 through openings 418 (FIG. 4A). Springs 433 replace sleeves 410 (FIG. 4A) to help align and couple electronic modules 408 with multilayer wiring board 416. Springs 433 are helical springs with a rectangular cross-section. Pressure plate 420 (described further below in conjunction with FIG. 13) is attached to the bottom surface of antenna honeycomb 404 with fasteners 422, thereby sandwiching multilayer wiring board 416 and electronic modules 408 between antenna honeycomb 404 and pressure plate 420. Pressure plate 420 includes six rectangular waveguides within pressure plate 420 (described below in conjunction with FIG. 4C) for collecting the RF energy.

Figure 4C:
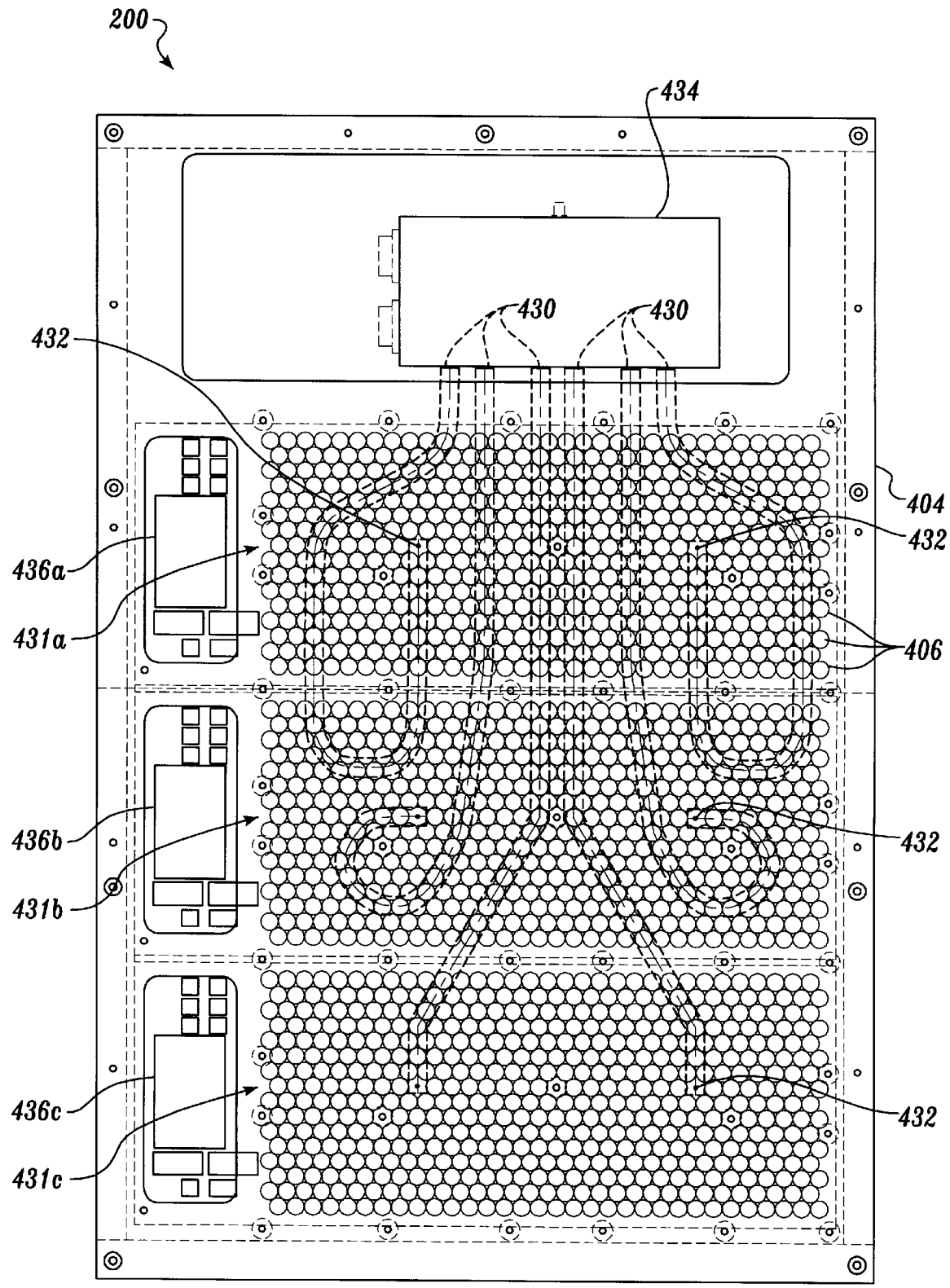

FIG. 4C shows a top view of antenna 200 with multilayer wiring board 416 (FIG. 4B) and six rectangular waveguides 430 in pressure plate 420 (FIG. 4B), shown in phantom. Each waveguide 430 is coupled at one end to a microwave combiner 434 (described below in conjunction with FIG. 14). In another embodiment, microwave combiner 434 may be replaced with a true time delay network (described below in conjunction with FIG. 15).

At its other end, each waveguide 430 is coupled to multilayer wiring board 416 through a corresponding stripline-to-waveguide coupler 432. Multilayer wiring board 416 routes and combines the RF signals outputted by the electronic modules 408 corresponding to approximately one half of a section 431 to one of the stripline-to-waveguide couplers 432. More specifically, for each group (i.e., approximately one half of a section 431) of electronic modules 408, the RF stripline corresponding to each electronic module is coupled to a single stripline through power combiners (described below in conjunction with FIG. 8A) included in multilayer wiring board 416. Thus, the RF output signals for either 253 or 254 electronic modules are combined and then coupled to a stripline-to-waveguide coupler 432 through a single stripline. Each stripline-to-waveguide coupler 432 operates to transition the RF signal from its corresponding single stripline to its corresponding single waveguide 430 in pressure plate 420.

Antenna 200 also includes external (i.e., external to the aircraft's cabin) beam steering controller (EBSC) circuits 436A–436C mounted on multilayer wiring board 416, corresponding to sections 431A–431C. Antenna honeycomb 404 and pressure plate 420 include cutouts 437 (FIG. 4B) to provide access to EBSC circuits 436A–436C mounted on multilayer wiring board 416. In this embodiment, EBSC circuits 436A–436C include drivers and multiplexers to route phase control signals to electronic modules 408 from controller 305 (FIG. 3B). EBSC circuits 436A–436C also include a logic circuit to convert the parallel output of controller 305 (FIG. 3B) to the serial data streams required by electronic modules 408. Controller 305 can include any suitable beam steering control unit, which are well known in the art of phased-array antennas. EBSC circuits 436A–436C each provide digital phase control signals from controller 305 (FIG. 3B) to the electronic modules corresponding to its section to electronically steer the beam of antenna 200. Referring back to FIG. 4B, a seal plate 438, together with WAIM 402 seal and protect the top surface of antenna honeycomb 404 and EBSC circuits 436A–436C. A seal plate 439 seals the bottom surface of antenna 200.

Referring to FIGS. 4A–4C, a received DBS signal flows through antenna 200 as follows. The DBS signal propagates through WAIM 402 into waveguides 406 of antenna honeycomb 404. The DBS signal then propagates through waveguides 406 into electronic modules 408. Each electronic module receives, amplifies, and combines the orthogonal component signals of the oncoming circularly polarized DBS signal to form a combined RF signal. Each electronic module then amplifies and phase shifts the combined RF signal to form an RF output signal. The RF output signal from each electronic module 408 is then conducted on a corresponding stripline in multilayer wiring board 416 through elastomeric connectors 419.

Each signal from each electronic module 408 then propagates through the electronic module's corresponding stripline to power combiners (described further below in conjunction with FIG. 8A) in multilayer wiring board 416. The power combiners then combine the signals from a group (i.e., approximately one half section) of electronic modules 408 into a single "collected" signal propagated on a single stripline. The "collected" signal corresponding to each group of electronic modules 408 is then conducted to a corresponding waveguide 430 in pressure plate 420 through a stripline-to-waveguide coupler 432 that is coupled between this waveguide 430 in pressure plate 420 and a corresponding single stripline carrying the "collected" signal in multilayer wiring board 416. Each of the six waveguides 430 in pressure plate 420 propagates the six "collected" signals to waveguide combiner 434 which combines them to form the antenna output signal to LNB 308 (FIG. 3B).

Figure 1:
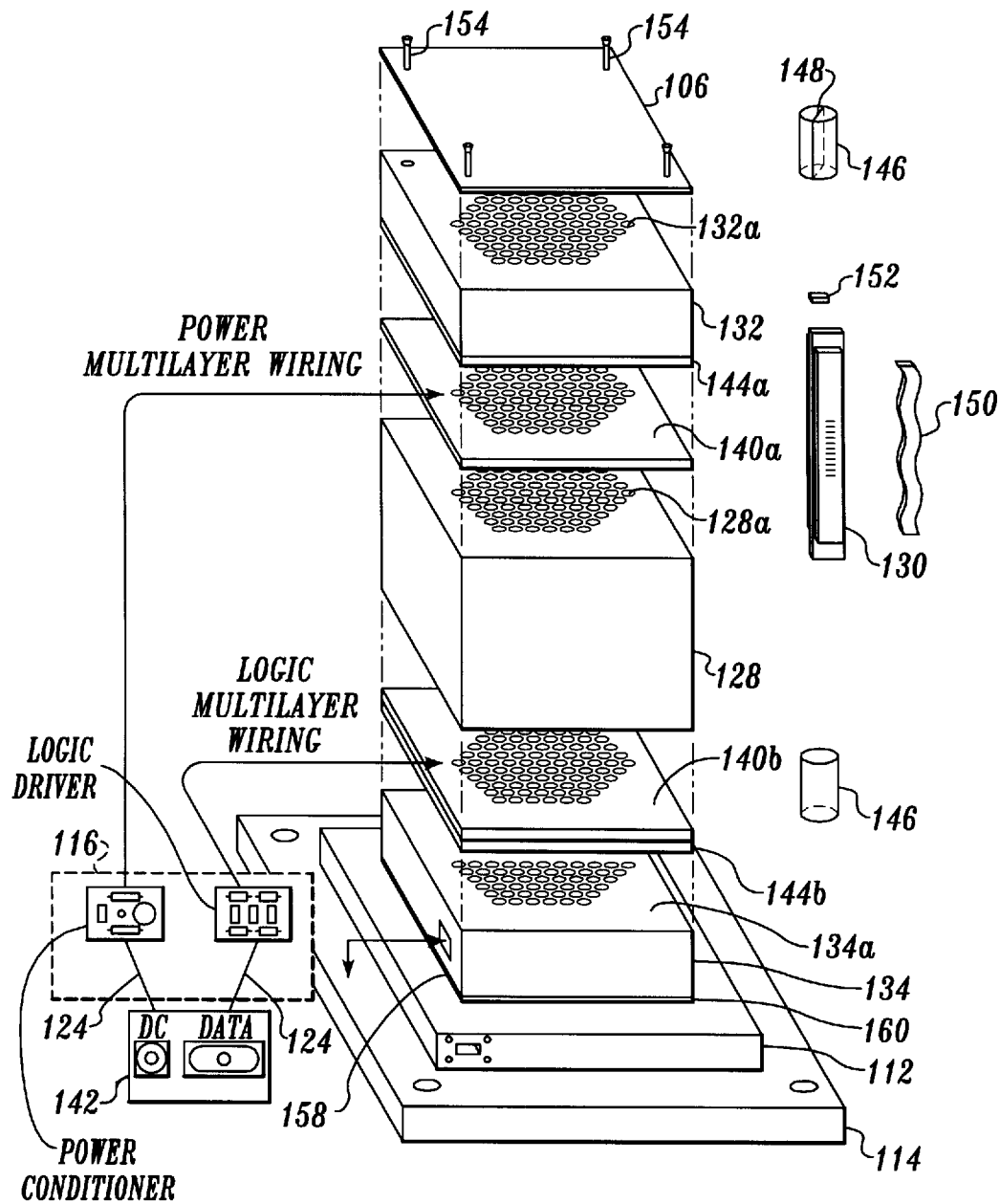
FIG. 1 is an exploded top perspective of an "in-line" phased-array antenna.

The use of striplines in multilayer wiring board 416 and waveguides in pressure plate 420 provide an optimal solution for balancing the area needed for DBS signal propagation, signal loss, antenna size and cost. Some other schemes, such as, for example, using coaxial cables instead of waveguides (in pressure plate 420) result in a relatively large signal loss, which typically is compensated for by increasing the gain (and, thus, complexity and cost) of electronic modules 408. Other schemes, such as, for example, a pure waveguide scheme instead of striplines in multilayer wiring board 416 is similar to the in-line approach (used in antenna 100 depicted in FIG. 1) that requires more costly modules and increased antenna size, weight and thickness.

Figure 5:
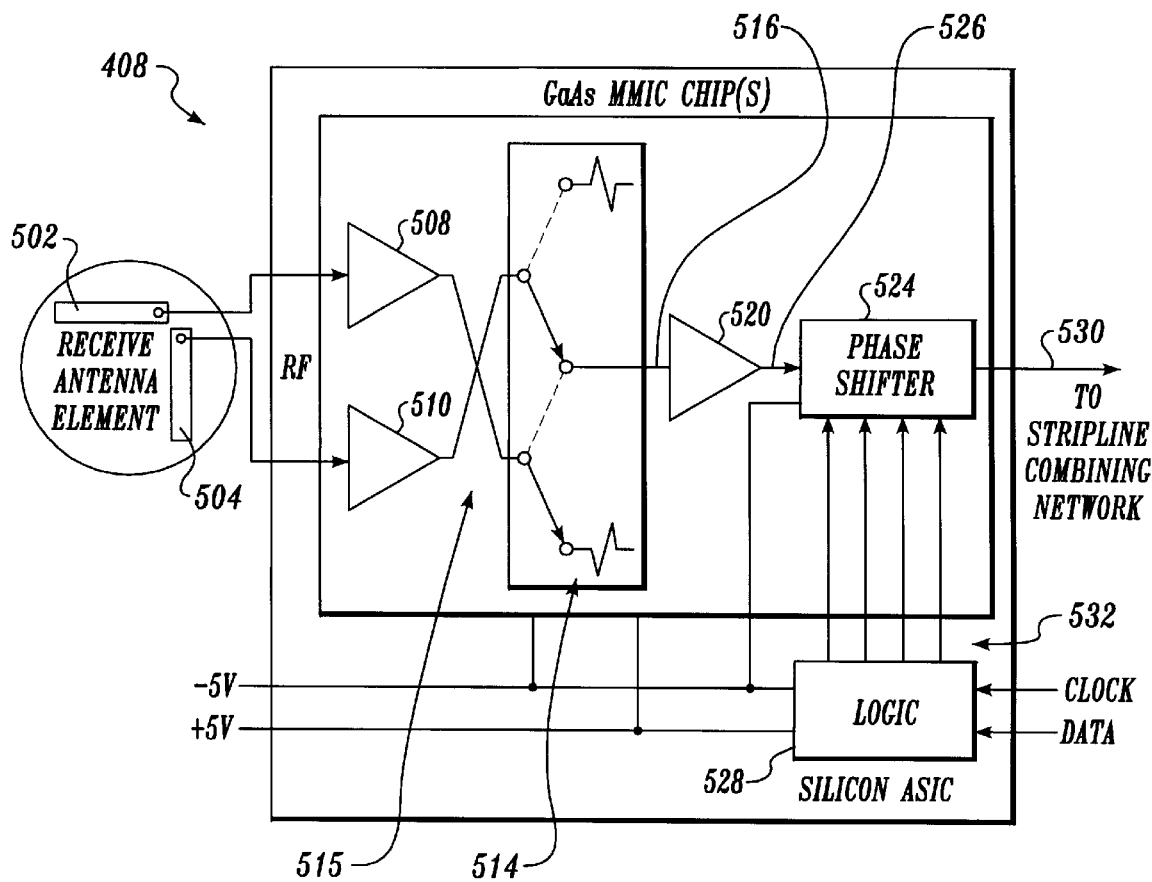
FIG. 5 is a block diagram of an electronic module according to one embodiment of the present invention.

FIG. 5 shows an electronic block diagram of an electronic module 408 according to one embodiment of the present invention. Electronic module 408 includes a first probe 502 and a second probe 504. Probes 502 and 504 are used to couple the EM signals from the DBS satellites into an individual electronic module 408. Probes 502 and 504 are oriented orthogonally so that the circularly polarized DBS signals can be resolved into two linearly polarized component signals.

Probes 502 and 504 are respectively coupled to the input leads of low noise amplifiers (LNAs) 508 and 510. In this embodiment, LNAs 508 and 510 can be implemented in custom designed GaAs MMICs. The output leads of LNAs 508 and 510 are connected to a polarity switch 514 through a 90° quadrature network of quadrature hybrid 515. Polarity switch 514 can be selectably configured for right-hand circularly polarized signals or left-hand circularly polarized signals.

Quadrature hybrid 515 receives signals from probes 502 and 504 and splits the signal received from each probe into two portions. Quadrature hybrid 515 introduces a 90° phase delay in one portion of the signal from probe 502 and combines this signal portion with one portion of the signal from probe 504 to form a RHC output signal representing the sum of the linear component signals of a right-hand circularly polarized signal received at probes 502 and 504. Similarly, quadrature hybrid 515 also introduces a 90° phase delay in the other portion of the signal received from probe 504 and combines this signal portion with the other portion of the signal from probe 502 to form a LHC output signal representing the sum of the linear component signals of a left-hand circularly polarized EM signal received at probes 502 and 504.

Polarity switch 514 receives the RHC and LHC output signals from quadrature hybrid 515 and, depending on how it is configured, conducts one of the signals to output lead 516 and the other to a match load (not shown). In this embodiment, the matched load is a 50Ω impedance. For example, if the received DBS signals were right-hand circularly polarized signals, polarity switch 514 would be selectably configured to conduct the RHC output signal from quadrature hybrid 515 to output lead 516 and the LHC output signal to the matched load.

Output lead 516 of polarity switch 514 is connected to an amplifier 520, which serves to amplify either the RHC or LHC output signals from quadrature hybrid 515 as selected by polarity switch 514. Amplifiers 508 and 510, polarity switch 514, and quadrature hybrid 515 can be implemented on a single GaAs MMIC.

Amplifier 520 outputs the amplified combined signal to a phase shifter 524 through a line 526. Amplifier 520 can be a custom designed microwave amplifier implemented on a single GaAs MMIC. Phase shifter 524 can be a custom designed lumped-element phase shifter implemented on a single GaAs MMIC. Of course, conventional GaAs phase shifter MMICs, such as, for example, model RMM3020, available from Raytheon can be used with an increase in area. Phase shifter 524 provides a phase shift in 22.5° increments in response to a 4-bit digital signal from a logic circuit 528. Phase shifter 524 outputs the phase shifted combined signal on an output lead 530, which is coupled to a stripline of multilayer wiring board 416 (FIG. 4A).

The custom designed GaAs MMICs used in this embodiment can be custom built by several MMIC manufacturers, such as, for example, Hewlett Packard, Microwave Technology Division, Santa Rosa, Calif. LNAs 508 and 510 and amplifier 520 provide approximately 30 dB of gain. Polarity switch 514, quadrature hybrid 515 and phase shifter 520 have a combined loss of approximately 10 dB. Accordingly, the net gain of each electronic module is approximately 20 dB.

Logic circuit 528 is implemented from a custom silicon CMOS integrated circuit and, like the MMICs, is coupled to receive power from power conditioner 302 (FIG. 3B) through multilayer wiring board 416 (FIG. 4A). In addition, logic circuit 528 also receives data and clock signals from controller 305 (FIG. 3B). Logic circuit 528 receives serial data from controller 305, buffers the phase state information and provides the 4-bit parallel phase delay setting to phase shifter 524, through lines 532. Logic circuit 528 also provides a signal to configure polarity switch 514. Logic Circuit 528 can also be custom designed by one skilled in the art of CMOS circuit design and built by any of several CMOS integrated circuit manufacturers.

Figure 6A:
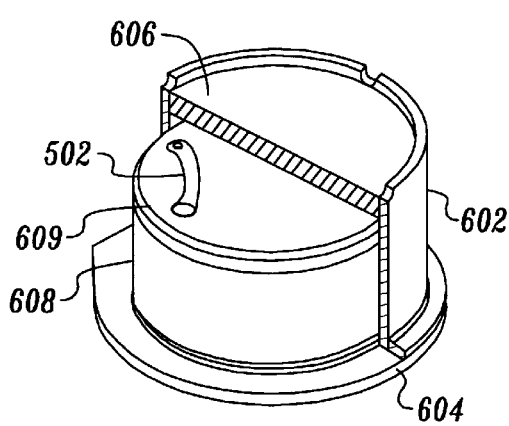

FIG. 6A is an antenna-end perspective of one embodiment of an electronic module 408. To reduce cost, electronic module 408 is housed in a package based on a standard model T0-8 transistor canister. Because the T0-8 canister is a standard part for packaging discrete transistors, the T0-8 canister is available commercially in large quantities at very low cost compared to custom packages or housings. The T0-8 canister includes a metal can 602 and a header 604. Metal can 602 is available with a hermetic glass window 606 in one end. Header 604 is hermetically sealed to the open end of metal can 602 in the conventional manner. Such T0-8 metal cans with hermetic glass windows are typically used for light emitting diodes or EPROMs. A portion of metal can 602 is cut away in this view to show the interior of electronic module 408. Metal can 602 serves as a waveguide to propagate RF signals received via waveguides 406 of antenna honeycomb 404 (FIG. 4).

Lightning induced currents in the surface of antenna honeycomb 404 typically have their high amplitude component signals in the lower end of their frequency range. The module waveguide formed by metal can 602 behaves like a high pass filter that will not propagate RF energy below its cut-off frequency. Because the waveguide formed by metal can 602 is an integral part of electronic module 408, the lower frequency component signals are not propagated by the module. Thus, the MMICs of electronic module 408 have protection from lightning induced surface currents in antenna honeycomb 404. Further, the small size of electronic modules 408 allows antenna 200 (FIG. 2) to be thinner, which is highly desirable in many applications.

The T0-8 canister also includes a glass window 606 hermetically sealed to the open end of metal can 602. A portion of glass window 606 is cut away to better show the interior of electronic module 408. A dielectric fill 608 is positioned between header 604 and glass window 606. The dielectric fill can be any type of low loss dielectric, such as, for example, PTFE 6002 available from Rogers, Chandler, Ariz. Preferably, the thermal characteristics of the dielectric fill match the thermal characteristics of the T0-8 transistor canister. Probe 502 and probe 504 (shown in FIG. 6D described below) are formed photolithographically on the top surface of a teflon-fiberglass substrate 609. Substrate 609 is bonded to the top surface of dielectric fill 608. Probes 502 and 504 are positioned adjacent to waveguide window 606 to optimize coupling with incoming DBS signals. In addition, probes 502 and 504 are shaped to optimize coupling with incoming DBS signals and isolation between the probes (i.e., probes 502 and 504 are optimized to couple the $TE_{1,1}$ mode, which is the desired dominant mode of a circular waveguide).

Figure 6B:
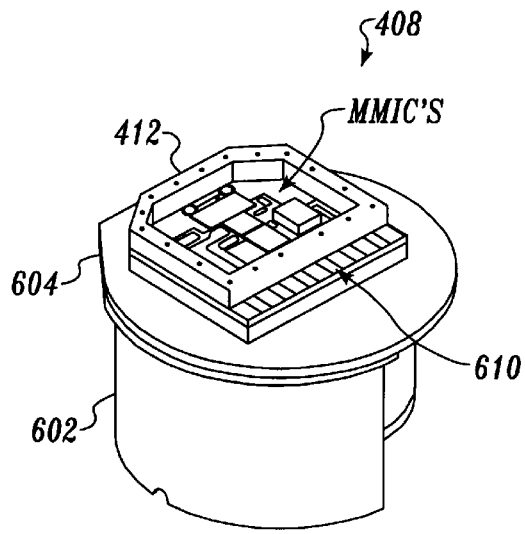
Figure 69:
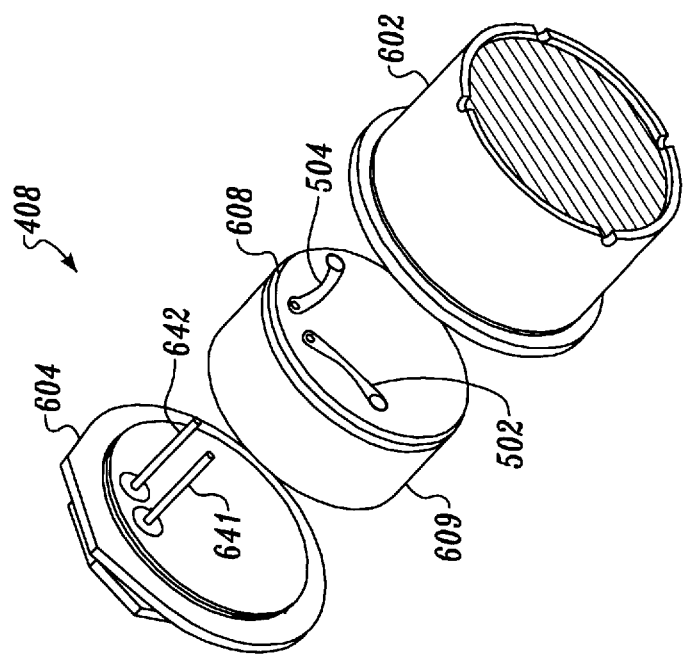
Figure 69:
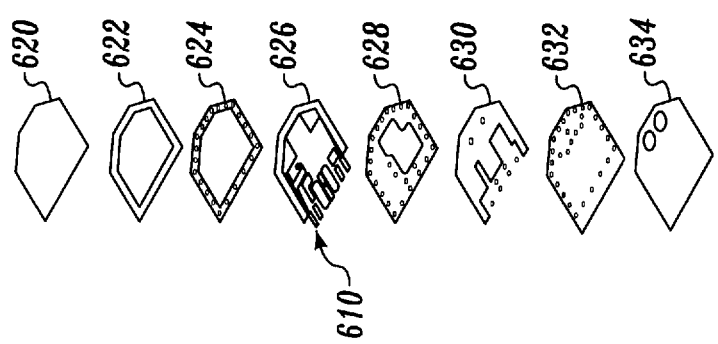

FIG. 6B shows a semiconductor circuit-end perspective of electronic module 408, with the lid from semiconductor package 412 removed for clarity. Semiconductor package 412 is mounted on header 604 and includes connector contacts 610 for coupling electronic module 408 to multilayer wiring board 416. Semiconductor package 412 includes the MMICs and CMOS logic integrated circuit implementing the block diagram shown in FIG. 5. Semiconductor package 412 is described further below in conjunction with FIGS. 6C and 7.

FIG. 6C shows an exploded view of one embodiment of semiconductor package 412. In this embodiment, semiconductor package 412 is a multilayered high-temperature cofired ceramic package and includes conductors for providing interconnection between the semiconductors (FIG. 6B) mounted within semiconductor package 412. In addition, semiconductor package 412 is shaped to serve as a keying structure so that the electronic module is properly aligned when coupled to multilayer wiring board 416 (FIG. 4A). Although a high-temperature cofired ceramic package is described, other embodiments may use low-temperature cofired ceramic packages.

Semiconductor package 412 includes a metal lid 620 to cover and protect the semiconductors (FIG. 6B) contained within semiconductor package 412. Lid 620 is attached to the top surface of a ceramic seal ring 624. Ceramic seal ring 624 is connected by vias to a source of ground potential to help isolate the MMICs placed in semiconductor package 412 from external electric fields. The bottom surface of ceramic seal ring 624 is in turn attached to the top surface of a top conductor 626. Top conductor 626 provides conductive paths for interconnecting the active circuitry and providing power. In this embodiment, top conductor 626 also provides connector contacts 610 for interconnection with multilayer wiring board 416 (FIG. 4A).

The bottom surface of top conductor 626 is attached to the top surface of a dielectric layer 628. The bottom surface of dielectric layer 628 is attached to the top surface of a buried conductor 630. Dielectric layer 628 provides electrical isolation between buried conductor 630 and top conductor 626. Buried conductor 630 provides additional conductive paths for interconnecting the active circuitry (FIG. 6B) and providing power. In addition, a dielectric layer 632 is inserted between buried conductor 630 and a backside metal layer 634. Dielectric layer 632 provides electrical isolation between buried conductor 630 and backside metal layer 634.

Lid 620, metal seal ring 622, dielectric seal ring 624, top conductor 626, dielectric layer 628, buried conductor 630, dielectric layer 632 and backside metal layer 634 are attached together, thereby hermetically sealing MMIC and CMOS integrated circuits (FIG. 6B) bonded within semiconductor structure 610. As a result, semiconductor package 412 provides a cavity and a substrate upon which the MMIC and CMOS integrated circuits are mounted. Semiconductor package 412 is brazed onto header 604 with backside metal layer 634 adjacent to header 604 (FIG. 6B).

FIG. 6D shows an exploded view of one embodiment of electronic module 408. Leads 641 and 642 are respectively connected to probes 502 and 504 through dielectric fill 608. Leads 641 and 642, dielectric fill 608, substrate 609 and probes 502 and 504 are housed within metal can 602 and sealed at one end by header 604. Metal can 602 is approximately 0.28 inches long and has an inner and outer diameter of approximately 0.40 and 0.44 inches, respectively. Header 604 has a diameter of approximately 0.5 inches. Metal can 602 and header 604 can be made of any suitable conductive material, such as, for example, Kovar®.

Figure 6E:
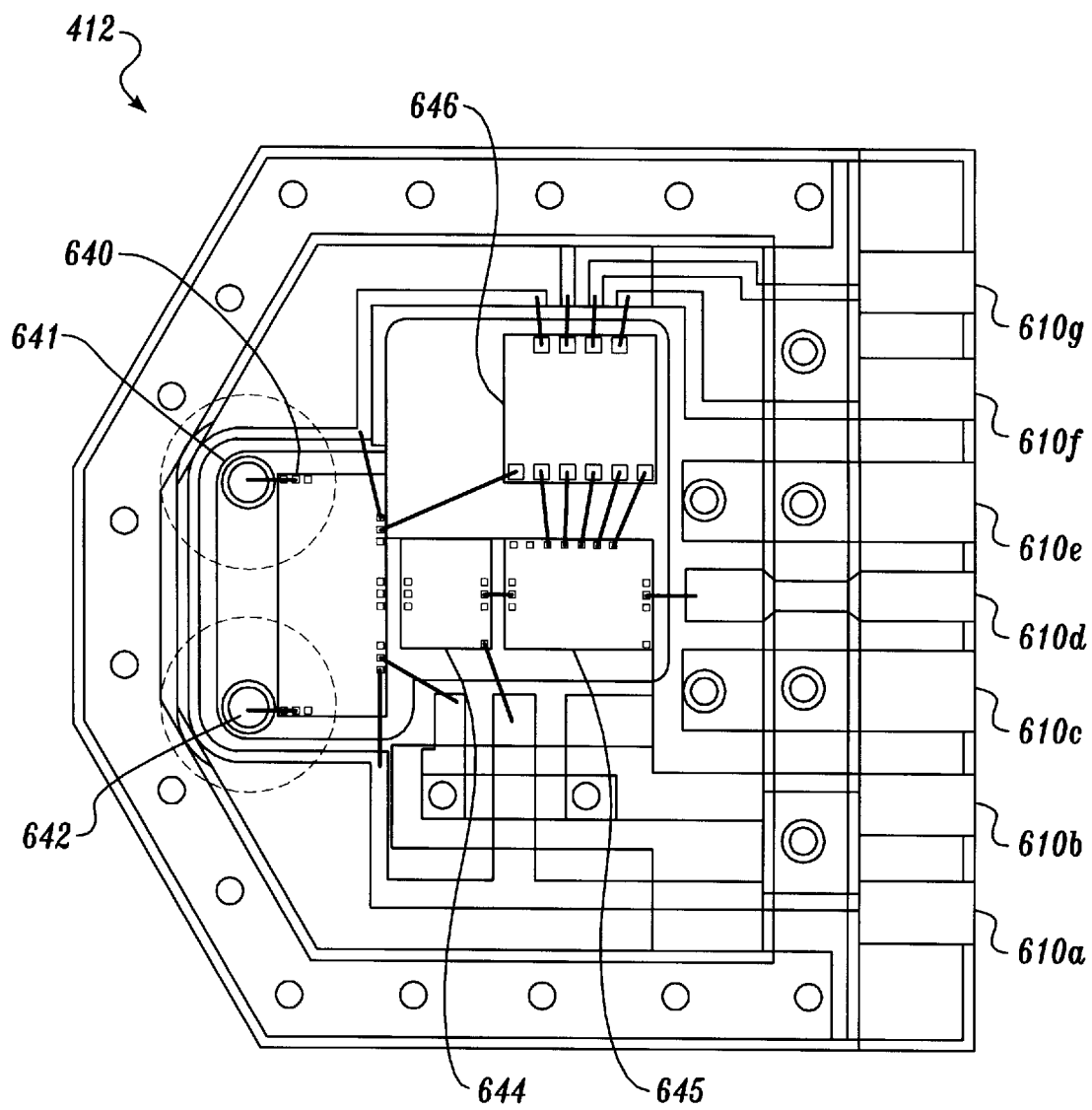

FIG. 6E is a top plan view of semiconductor package 412, with lid 620 removed to show the MMICs. Semiconductor package 412 includes the semiconductor integrated circuits implementing LNAs 508 and 510, quadrature hybrid 515, polarity switch 516, amplifier 520, phase shifters 524 and logic circuit 528 (FIG. 5). Connector contacts 610 remain uncovered by lid 620, to be coupled to corresponding connector contacts (described below in conjunction with FIG. 8A) in multilayer wiring board 416 (FIG. 4A) using elastomeric connectors (described below in conjunction with FIGS. 10A and 10B). In this embodiment of semiconductor package 412, four semiconductor integrated circuits are used to implement the block diagram of FIG. 5. A MMIC 440 implements LNAs 508 and 510 and polarity switch 516 (FIG. 5), and is coupled to probes 502 and 504 (FIGS. 5 and 6A) through leads 641 and 642, which extend through the bottom of semiconductor package 412, header 604 (FIG. 6B), dielectric fill 608 and substrate 609 (FIG. 6A). MMICs 644–645 and CMOS integrated circuit 646 implement amplifier 520, phase shifters 524 and logic circuit 528, respectively (see FIG. 5).

Connector contacts 610 include seven conductive contacts that are gold-plated to provide good electrical contact when connected to multilayer wiring board 416 (FIG. 4). Connector contacts 610 are arranged in a "piano key" at one edge of semiconductor package 412. Connector contacts 610 include a +6 volt contact 610a for receiving +6 volt power from power conditioner 302 (FIG. 3B) through multilayer wiring board 416. Similarly, a −5 volt contact 610b is adapted to receive −5 volt power from power conditioner 302 (FIG. 3B) through multilayer wiring board 416. The +6 and −5 volt power is used to power the MMICs and CMOS integrated circuit contained in semiconductor package 412. Of course, different voltages can be provided to accommodate the power requirements of different MMICs.

A RF contact 610d is located between two GROUND contacts 610c and 610e. GROUND contacts 610c and 610e are connected to a source of ground potential through multilayer wiring board 416. RF contact 610d is connected to output lead 530 (FIG. 5) to conduct the RF output signal of each electronic module. GROUND contacts 610c and 610e along with RF contact 610d form a coplanar waveguide for conduction of the RF signal out of the electronic module.

Figure 7:
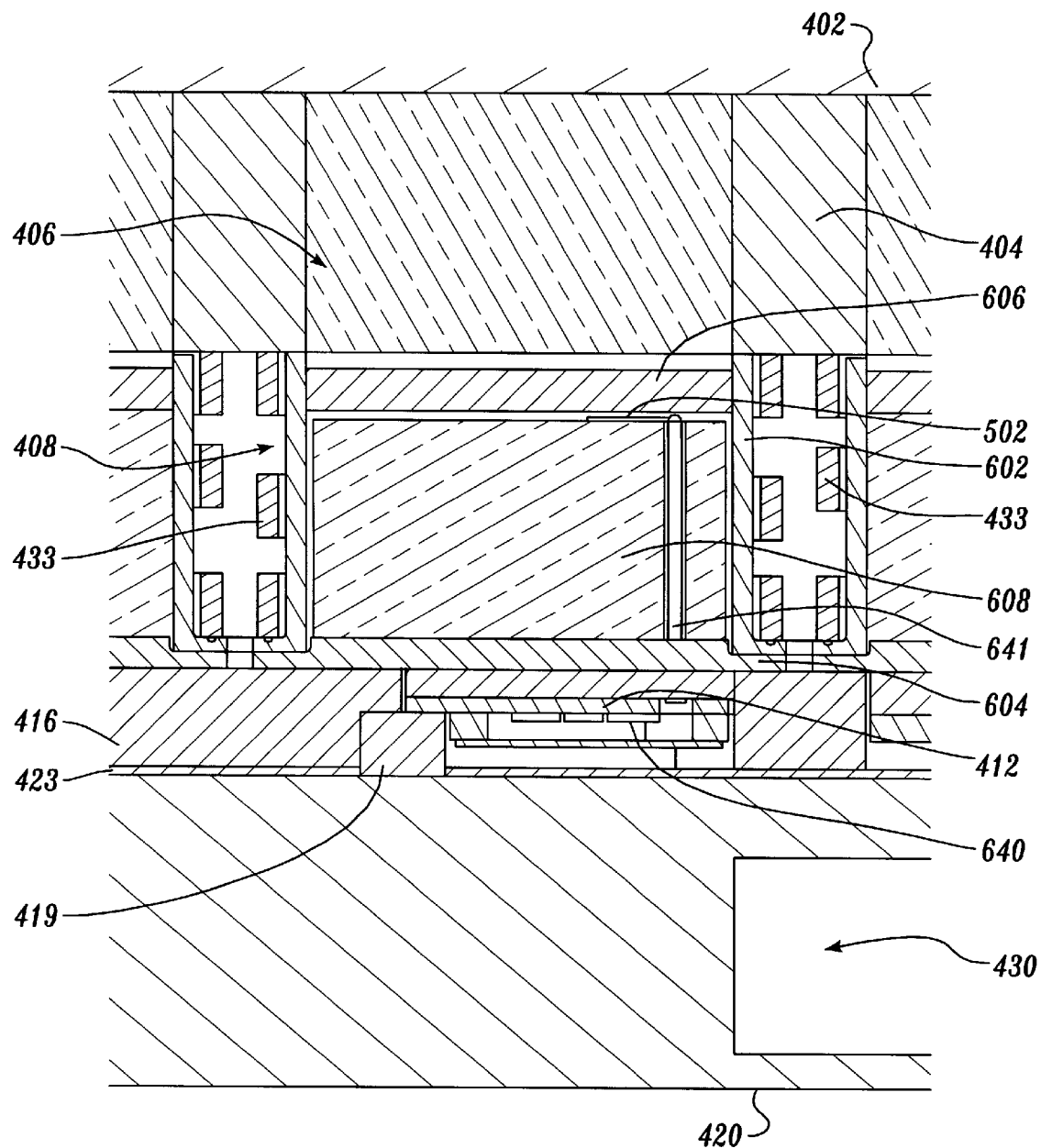
FIG. 7 is a vertical section of an electronic module according to one embodiment of the present invention.

FIG. 7 shows a cross-sectional view of electronic module 408, coupled between antenna honeycomb 404 and multilayer wiring board 416. In this embodiment, antenna honeycomb 404 includes a cross-linked polystyrene dielectric within circular waveguide 406. Electronic module 408 is positioned below and aligned with waveguides 406, with glass window 606 proximate to waveguide 406. In this embodiment, springs 433 replace sleeves 410 (FIG. 4A). Springs 433 are positioned between flanges 702 of the electronic modules and antenna honeycomb 404 and help keep the electronic modules aligned with nultilayer wiring board 416 and waveguide 406.

Within electronic module 408, probe 502 is positioned below and proximate to glass window 606. Probe 502 is connected to lead 641, which connects probe 502 to MMIC 640 through dielectric fill 608, header 604 and semiconductor package 412. Although not visible in this view, probe 504 (FIG. 5) is similarly positioned below and proximate to glass window 606 and coupled to MMIC 640 through lead 642 (FIG. 6D).

Elastomeric connector 419 (described further below in conjunction with FIG. 10C) couples semiconductor package 412 to multilayer wiring board 416. Pressure plate 420 and antenna honeycomb 404 are fastened together, thereby compressing elastomeric connector 419 against connector contacts 610 (FIG. 6D) and multilayer wiring board 416. Multilayer wiring board 416 has connector contacts (described below in conjunction with FIG. 9A) corresponding to connector contacts 610 of semiconductor package 412.

Figure 8A:
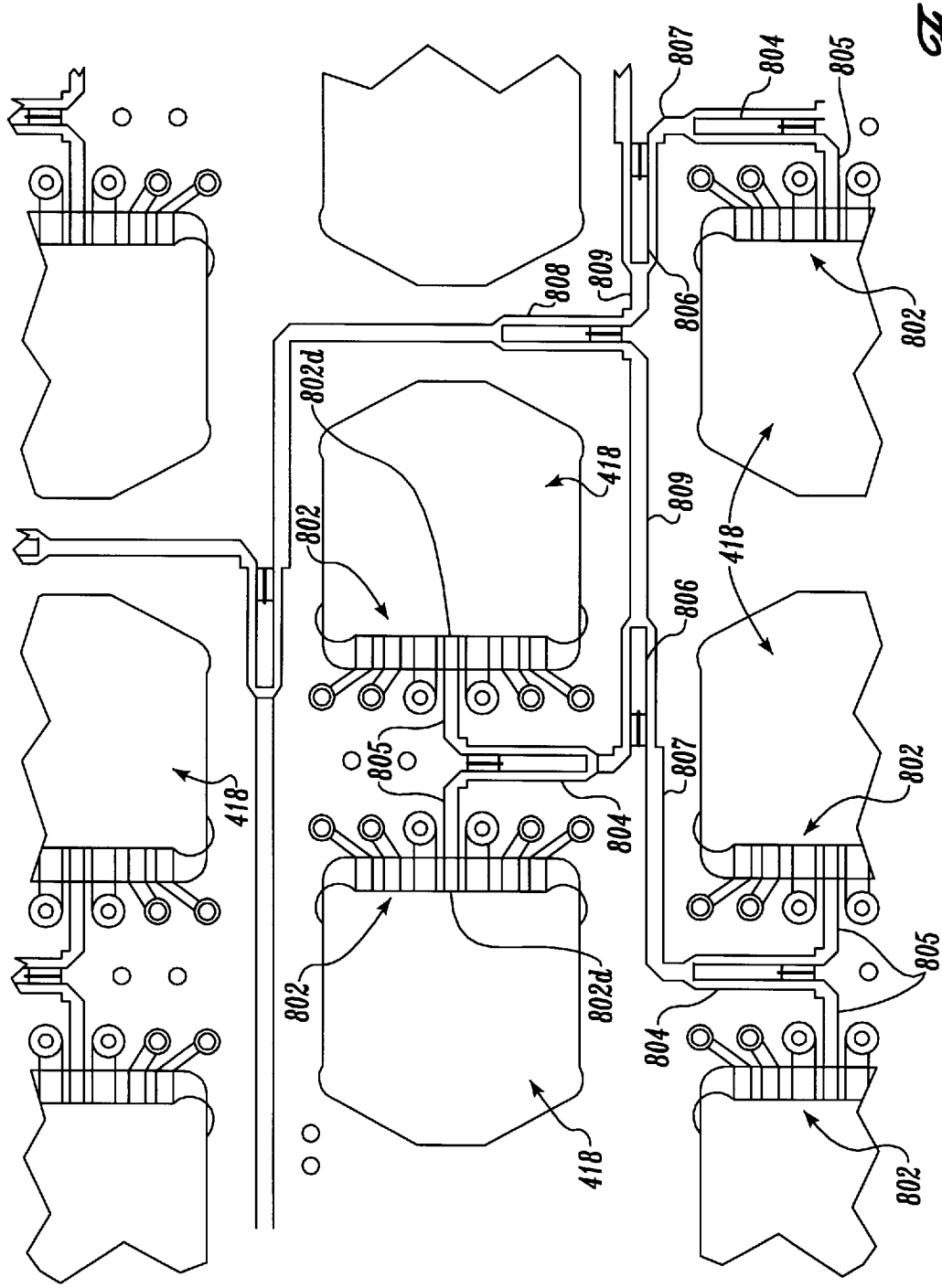
FIGS. 8A and 8B, respectively, are a top plan of a stripline metallization layer and a transverse section of a portion of a multilayer wiring board according to one embodiment of the present invention.

FIG. 8A shows a view of a portion of a layer of multilayer wiring board 416, according to one embodiment of the present invention. Each opening 418 includes associated "piano-key" connector contacts 802. Connector contacts 802 include gold-plated contacts 802a–802g, which correspond to contacts 610a–610g (FIG. 6E) of semiconductor package 412. Openings 418 are arranged in pairs so that for each pair of openings, the two sets of connector contacts 802 of each opening are facing each other. In each pair of openings, the RF contact of one opening is connected to the RF contact of the other opening through striplines 805 and "first level" two-way power combiner 804. In this embodiment, each "first level" power combiner 804 includes an equal level Wilkinson in-phase power combiner with a photolithographically defined isolation resistor. Wilkinson in-phase power combiners are well known in the art of phased-array antennas. Thus, each pair of electronic modules 408 (FIG. 4A) coupled to multilayer wiring board 416 provides its RF output signal to a "first level" power combiner 804.

The "first level" power combiners 804 are also grouped into pairs. Each "first level" power combiner 804 feeds a "second level" power combiner 806 through striplines 807.

"Second level" power combiners 806 are also identical Wilkinson power combiners substantially identical to "first level" power combiners 804. In addition, "second level" power combiners 806 are grouped into pairs that feed a "third level" power combiner 808 through striplines 809, and so on in a tree-like manner. As a result, the RF output signals of a group of electronic modules 408 are combined together in a single stripline in multilayer wiring board 416. For example, sixteen electronic modules are coupled together using fifteen two-way power combiners. The sixteen electronic modules are divided into eight pairs, with each pair coupled to a corresponding "first level" power combiner. These eight "first level" power combiners are divided into 4 pairs, with each pair of "first level" power combiners coupled to a "second level" power combiner. These four "second level" power combiners are coupled to two "third level" power combiners. Similarly, the two "third level" power combiners are coupled to a "fourth level" power combiner, for a total of fifteen power combiners. Of course, this scheme can be applied to larger groups of electronic modules. As stated above, antenna 200 (FIGS. 4B and 4C) has three groups of 253 electronic modules and three groups of 254 electronic modules.

The single stripline carrying the combined output signals of the group of electronic modules is then connected to a stripline-to-waveguide coupler 432 (FIG. 4C). The stripline-to-waveguide coupler can be, for example, a coaxial coupler (described below in conjunction with FIGS. 11A–11C) or, alternatively, a stripline-to-waveguide transition module (described below in conjunction with FIGS. 12A and 12B). The striplines and power combiners are arranged so that the propagation path from each electronic module 408 to its corresponding stripline-to-waveguide coupler is substantially equal to the propagation path of every other electronic module 408 to help maintain the phase relationship of the RF signals output by electronic modules 408. If the path lengths are not equal, difference can be compensated for to a first order by adjusting the module phase shifters to offset the phase error caused by the path length differences.

Figure 8B:
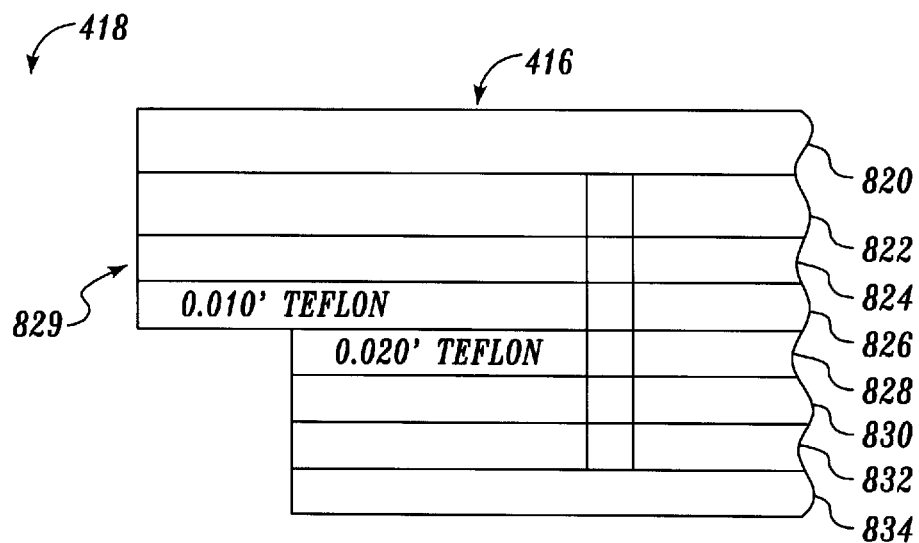

FIG. 8B shows a cross-sectional view of a portion of multilayer wiring board 416, according to one embodiment of the present invention. In this embodiment, multilayer wiring board 416 has eight dielectric layers alternated with nine metallization layers. A top dielectric layer 820 has a top surface attached to a top GROUND metallization layer. A +6 volt metallization layer is attached between the bottom surface of top dielectric layer and the top surface of a second dielectric layer 822. A −5 volt metallization layer is sandwiched between the bottom surface of dielectric layer 822 and the top surface of a dielectric layer 824. The +6 volt and the −5 volt metallization layers conduct the +6 volt and −5 volt power from power conditioner 302 (FIG. 3B) to semiconductor integrated circuits 640 and 644–646 (FIG. 6D).

A top stripline GROUND metallization layer is sandwiched between the bottom surface of dielectric layer 824 and the top surface of a dielectric layer 826. A stripline metallization layer is formed between the bottom surface of dielectric layer 826 and the top surface of a dielectric layer 828. The stripline metallization layer has striplines and power combiners (described above in conjunction with FIG. 8A), which are formed photolithographically. The stripline metallization layer is planar with contacts 610 of electronic modules 408 (FIG. 6B), thereby simplifying the propagation of RF signals between electronic modules 408 and multilayer wiring board 416.

In addition, dielectric layer 828 does not extend as far into opening 418 as dielectric layers 820–826, thereby forming a ledge 829 that defines the edge of opening 418. Dielectric layers 820–826 cause ledge 829 to have a thickness substantially equal to the thickness of the portion of semiconductor package 412 (FIG. 6B) containing connector contacts 610. A set of connector contacts 802 (FIG. 8A) are located on the bottom surface of ledge 829 (i.e., dielectric layer 826), extending to the edge of ledge 829 toward opening 418. As a result, connector contacts 802 are positioned in multilayer wiring board 416 so that conductor contacts 802 are substantially flush with conductor contacts 610 of electronic modules 408 when electronic modules 408 are properly connected to multilayer wiring board 416.

Each set of connector contacts 802 (and each set of connector contacts 610 of electronic modules 408) includes a +6 volt contact and a −5 volt contact for supplying the +6 and −5 volt power required by the semiconductor integrated circuits (FIG. 6D) from power conditioner 302 (FIG. 3B). In addition, each set of connector contacts 802 includes both a clock contact and a data contact for conducting a clock signal and serial data signal, respectively. The clock and data signals are used in adjusting phase shifters 524 as described above in conjunction with FIG. 5. Each set of connector contacts 802 also includes a RF contact, for propagating DBS signals and two GROUND contacts connected to a source of ground potential.

A bottom stripline GROUND metallization layer is sandwiched between the bottom surface of fifth dielectric layer 828 and the top surface of a sixth dielectric layer 830. Bottom stripline GROUND metallization layer, together with the top stripline GROUND metallization layer between dielectric layers 824 and 826, provide shielding for the striplines formed in the stripline metallization layer between dielectric layers 826 and 828.

A data metallization layer is sandwiched between the bottom surface of sixth dielectric layer 830 and the top surface of a seventh dielectric layer 832. The data metallization layer has a plurality of addressable serial data lines. A serial data line for each electronic module 408 is routed to the corresponding opening 418, and connected to the data contact of the corresponding set of connector contacts 802 through a via formed through dielectric layers 828 and 830.

A clock metallization layer is sandwiched between the bottom surface of seventh dielectric layer 832 and the top surface of an eight dielectric layer 834. Likewise, in the clock metallization layer, a clock line for each electronic module 408 is routed to the corresponding opening 418, and connected to the clock contact of the corresponding set of connector contacts 802 through a via formed through dielectric layers 828, 830, and 832.

A bottom GROUND metallization layer is attached to the bottom surface of eight dielectric layer 834. The top and bottom GROUND metallization layers provide shielding for the layers between the top and bottom GROUND metallization layers. The dielectric layers can be made of teflon.

Figure 9A:
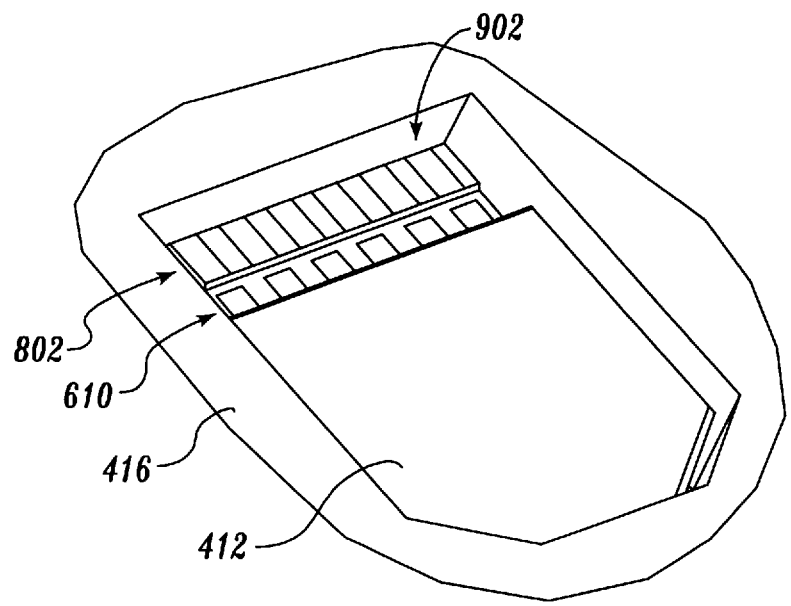
FIGS. 9A–9C, respectively, are a bottom perspective and a vertical section of a semiconductor package fitted to a multilayer wiring board, and an exploded perspective of an compliant connector coupling an electronic module to a multilayer wiring board, according to one embodiment of the present invention.
Figure 9B:
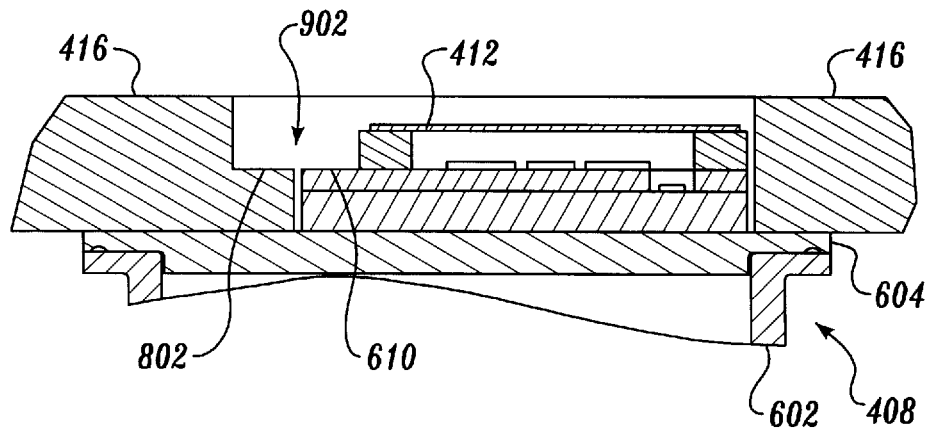

FIGS. 9A and 9B show, respectively, a bottom perspective and a cross-section of one embodiment of semiconductor package 412 fitted to multilayer wiring board 416. Connector contacts 802 of multilayer wiring board 416 are aligned and substantially flush with corresponding connector contacts 610 of semiconductor package 412 of an electronic module 408. Multilayer wiring board 416 and semiconductor package 412 form a cavity or recess 902 in which an elastomeric connector 419 (FIG. 7) is fitted. The elastomeric connector bridges the small gap between the two sets of "piano-key" connector contacts 802 and 610. Cavity 902 is approximately 0.065 inches deep in this embodiment. FIG.

9B shows a cross-sectional view of semiconductor package 412 fitted to multilayer wiring board 416.

Figure 9C:
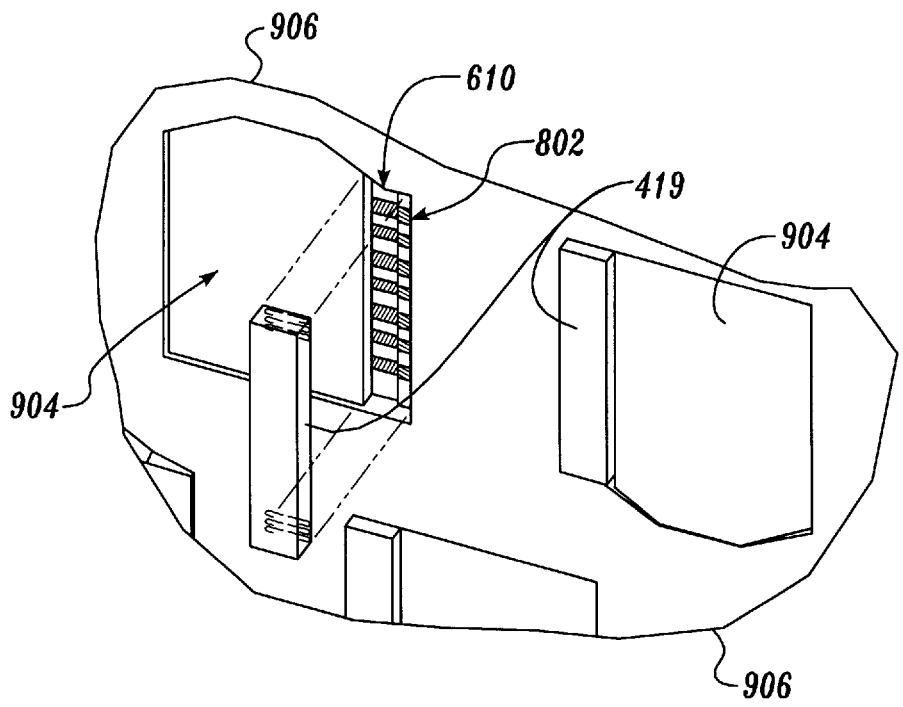

FIG. 9C shows an exploded view of an elastomeric connector 419 connecting semiconductor package 904 to multilayer circuit card 906, according to another embodiment of the present invention. In this embodiment, semiconductor package 904 is substantially identical to semiconductor package 412 (FIGS. 9A and 9B) except that connector contacts 610 are located on the side of semiconductor package 904 instead of an end as in semiconductor package 412. Similarly, multilayer circuit card 906 is substantially identical to multilayer wiring board 416 (FIGS. 9A and 9B) except that multilayer circuit card 906 has connector contacts 802 positioned to be aligned with connector contacts 610 of semiconductor package 904 instead of semiconductor package 412 as in multilayer wiring board 416.

When semiconductor package 904 is fitted to multilayer circuit card 906, connector contacts 610 and 802 are aligned and flush with each other. The elastomeric connector 419 is positioned on top of both sets of connector contacts to provide a "bridge" interconnect between the corresponding contacts. Each elastomeric connector 419 includes conductors disposed on a resilient backing that provide low loss and low VSWR (voltage standing wave ratio) when compressed against connector contacts 610 and 802 by pressure plate 420 and fasteners 422. In addition, because elastomeric connectors are solderless, assembly and repair of the antenna are simplified.

Figure 10A:
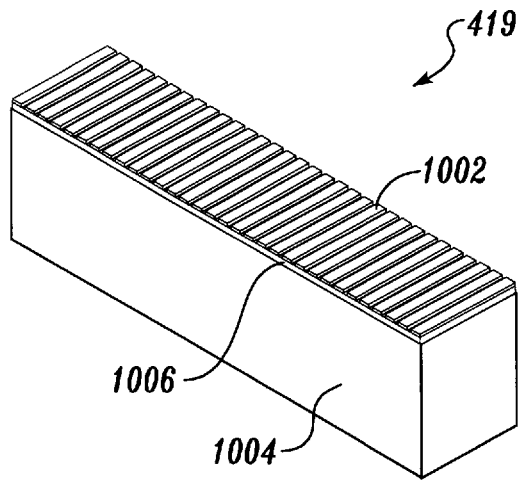
FIGS. 10A and 10B, respectively, are exploded perspectives of two embodiments of an compliant connector, according to the present invention.

FIG. 10A shows a perspective of one embodiment of elastomeric connector 419. Elastomeric connector 419 includes gold-plated copper traces 1002 fixed to the surface of a resilient non-conductive backing 1004 with a backing layer 1006. Backing layer 1006 is made of approximately 0.002 inch thick Kapton®. Backing 1004 is made of silicone and is approximately 0.090 inches thick. Traces 1002 are approximately 0.005 inches wide, 0.002 inches thick and separated from neighboring traces by approximately 0.002 inches. Traces 1002 are substantially parallel and extend across the width of silicone backing 1004, thereby providing a plurality of substantially parallel conductive paths across elastomeric connector 419. Because backing 1004 is resilient, elastomeric connector 419 can be to approximately 0.065 inches to fit within cavity 902 (FIGS. 9A and 9B). Elastoineric connectors are available in different sizes and shapes from Elastomeric Technologies, Inc., Hatboro, Pa.

Figure 10B:
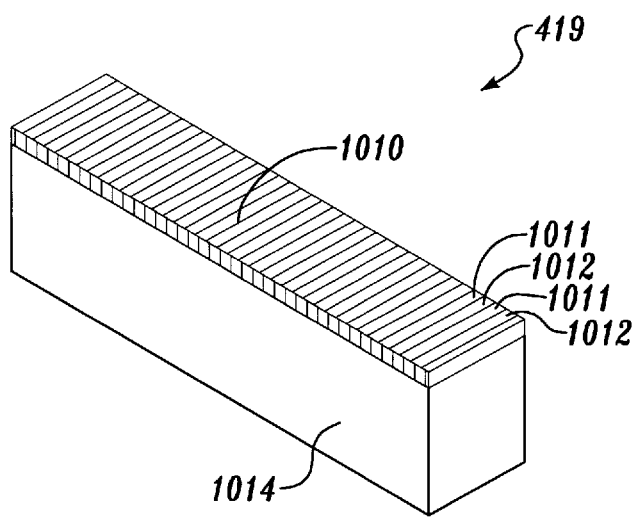

FIG. 10B shows a perspective of another embodiment of elastomeric connector 419 using a zebra layer 1010 of alternating parallel conductive layers 1011 and non-conductive layers 1012. Zebra layer 1010 is attached to a non-conducting resilient backing 1014, with conductive layers 1011 and non-conductive layers 1012 running across the width of backing 1014. Zebra layer 1010 is approximately 0.010 inches thick and made of conductive and non-conductive polymers. Backing 1014 is made of silicone and is approximately 0.080 inches thick.

Figure 11A:
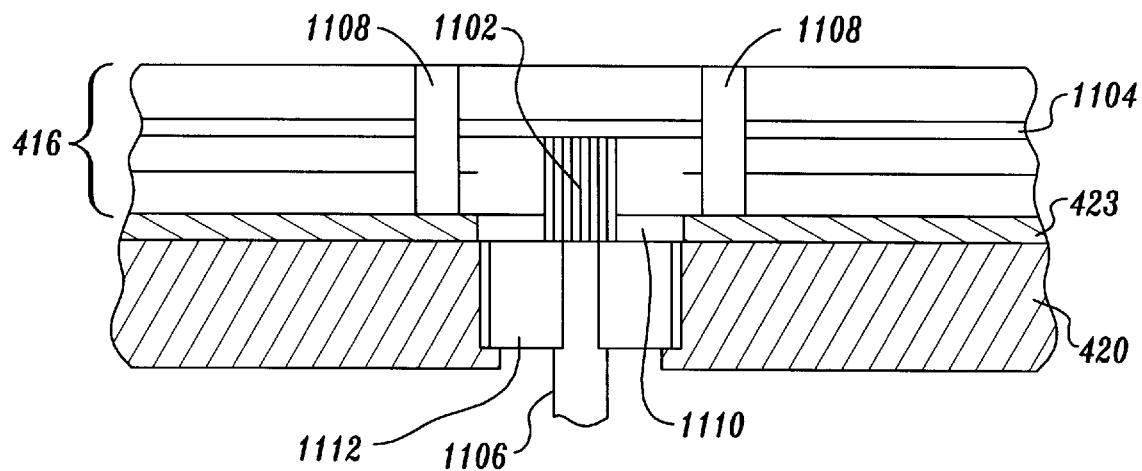
FIGS. 11A–11C, respectively, are a vertical section of a stripline-to-coaxial- transition, a vertical section of a coaxial-to-waveguide transition, and a bottom perspective of a multilayer circuit card showing a cavity for a vertical compliant connector.
Figure 11B:
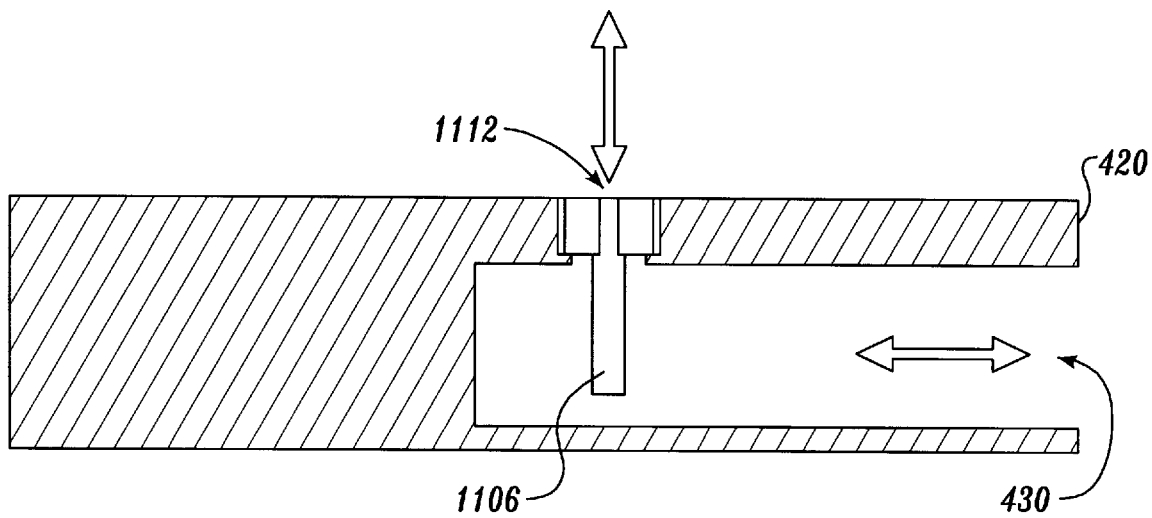

FIG. 11A–11B, respectively, show a cross-section of a stripline-to-coaxial- transition and a cross-section of a coaxial-to-waveguide transition, which together form one embodiment of a stripline-to-waveguide coupler 432 (FIG. 4C). As shown in FIG. 11A, a vertical elastomeric connector 1102 is used to couple a stripline 1104 to a probe 1106. Elastomeric connector 1102 is similar to elastomeric connector 419 (FIGS. 10A and 10B) except that the conductors are disposed along the vertical length of the elastomeric connector instead of the width as in elastomeric connector 419. Stripline 1104 represents the single stripline propagating the "collected" RF signal of approximately one half the electronic modules of a section 431 (described above in conjunction with FIGS. 4A–4D). Elastomeric connector 1102 serves as the inner conductor of a segment of a coaxial transmission line (i.e., the segment through multilayer wiring board 416) used to propagate the "collected" RF signal from multilayer wiring board 416 to an individual waveguide 430 (FIG. 4D). To connect the outer coaxial shield, multiple plated vias 1108 in multilayer wiring board 416 are connected to the stripline GROUND metallization layers (FIG. 8B) and surround the inner coaxial conductor formed by elastomeric connector 1102.

Elastomeric connector 1102 is fitted into a cavity (described below in conjunction with FIG. 11C) in multilayer wiring board 416 and through a spacer 1110 fitted in a cutout in shim 423 positioned between multilayer wiring board 416 and pressure plate 420. Spacer 1110 has a thickness substantially equal to the thickness of shim 423 and can be made of any suitable dielectric material, such as, for example, cross-linked polystyrene.

Probe 1106 serves as the inner conductor of the next segment (i.e., the segment into pressure plate 420) of the coaxial transmission line used to propagate the "collected" RF signal from multilayer wiring board 416 to waveguide 430 (FIG. 4D). Pressure plate 420 serves as the outer shield conductor of this segment of the coaxial transmission line. Probe 1106 is fitted through a modified bead 1112, with the top surface of probe 1106 being substantially flush with the top surface of bead 1112. Bead 1112 serves as a dielectric fill between the inner and outer conductors of the coaxial transmission line used to propagate the "collected" RF signal from multilayer wiring board 416 to waveguide 430 (FIG. 4D).

As shown in FIG. 11B, probe 1106 extends from bead 1112 into an individual waveguide 430. In this embodiment, probe 1106 includes a conductive sleeve to increase the diameter of the portion of probe 1106 that extends into waveguide 430. Probe 1106 radiates the "collected" RF signal from stripline 1104 (FIG. 11A) into waveguide 430.

Figure 11C:
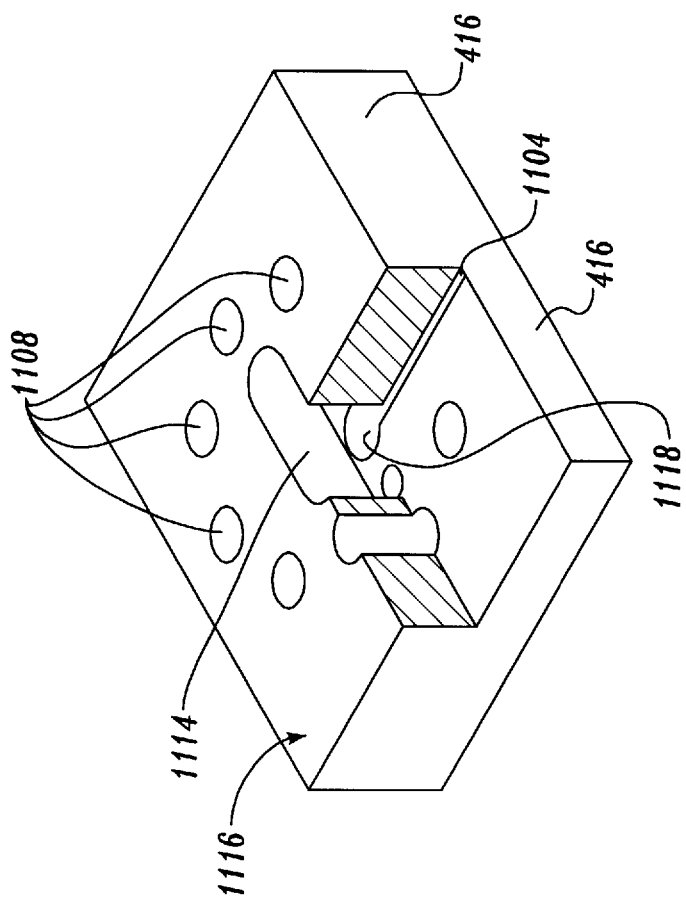

FIG. 11C shows a bottom perspective of a portion of multilayer wiring board 416 with a cavity 1114 for a vertical elastomeric connector 1102 (FIG. 11A). A section of multilayer wiring board 416 is cutaway in this view for clarity. Surface 1116 of multilayer wiring board 416 faces pressure plate 420 (FIG. 11A). Cavity 1116 is made to expose the end of stripline 1104, which propagates the "combine" RF signal described above. A pad 1118 is formed at the end of stripline 1104 to facilitate adequate electrical contact between elastomeric connector 1102 (FIG. 11A) and stripline 1104. FIG. 11C more clearly shows plated vias 1108 in multilayer wiring board 416 that implement the outer conductor of the coaxial transmission line through multilayer circuit card 416.

FIGS. 12A and 12B respectively show an assembled and exploded view of a stripline-to-waveguide transition module 1200 implementing a stripline-to-waveguide coupler, according to another embodiment of the present invention. Stripline-to-waveguide transition module 1200 includes a T0-8 metal can 602 of the same type used in electronic modules 408 (FIG. 4A). However, stripline-to-waveguide transition module 1200 includes a waveguide radiator structure 1201 instead of semiconductor package 412 as in an electronic module 408. Further, in this embodiment, multilayer wiring board 416 has openings corresponding to the shape of waveguide radiating structure 1201, with each opening being aligned with a corresponding waveguide in pressure plate 420 (described below in conjunction with FIG. 13). As a result, when stripline-to-waveguide transition module 1100 is connected to multilayer wiring board 416, stripline-to-waveguide transition module 1100 is aligned with a waveguide in pressure plate 420.

Waveguide radiator structure 1201 includes a waveguide window 1202 and a radiating probe 1204 mounted on a header 1206. Header 1206 is a T0-8 header with a rectangular waveguide opening. As is more clearly shown in FIG. 12B, radiating probe 1204 includes three connector contacts to be connected to the output stripline in multilayer wiring board 416. In this embodiment, radiating probe 1204 is connected to the single stripline and associated coplanar ground conductors carrying the combined output signals of a group of electronic modules 408, described above in conjunction with FIG. 9. In addition, waveguide radiator structure 1201 is aligned with the opening of one of the waveguides in pressure plate 420 (FIG. 4). An elastomeric connector is used to connect radiating probe 1204 to the single stripline and associated coplanar ground conductors carrying the combined output signals of a group of electronic modules 408.

To lower the waveguide cutoff frequency and permit propagation, a glass load 1210 is positioned within the rectangular waveguide opening 1207 in header 1206. For the same reasons, a dielectric block 1212 made of foam glass is positioned adjacent to header 1206 on the side facing the interior of metal can 602. A circular metal plate 1214 is positioned within metal can 602 adjacent to dielectric 1212 on the side opposite header 1206. Circular metal plate 1214 serves as a back short (to reflect EM signals excited within metal can 602) and seals the open end of the T0-8 transistor canister.

As stated above, stripline-to-waveguide transition module 1200 is connected to one of the single striplines and its associated coplanar ground conductors (in multilayer wiring board 416) carrying the combined output signals of a group of electronic modules 408. Stripline-to-waveguide transition module 1200 serves as a stripline-to-waveguide coupler to transition the combined output signals of the group of electronic modules 408 from a stripline in multilayer wiring board 416 to a waveguide in pressure plate 420 (as described above in conjunction with FIGS. 4A–4C). Additional stripline-to-waveguide transition modules, substantially similar to stripline-to-waveguide transition module 1200, are used to propagate the combined output signals of the other groups of electronic modules 408 from multilayer wiring board 416 to a corresponding waveguide in pressure plate 420 (as described above in conjunction with FIG. 4). The single stripline carrying the combined output signals of a group of electronic modules 408 is coupled to radiating probe 1204, whereby radiating probe 1204 excites the waveguide in pressure plate 420 to transition the combined signal from stripline to waveguide, with an insertion loss of approximately 1 dB.

FIG. 13 is an exploded perspective of one embodiment of pressure plate 420. Pressure plate 420 includes a backplate 1302 attached to a faceplate 1304, which are made of metal. In this embodiment, backplate 1302 and faceplate 1304 are made of a suitably coated aluminum or aluminum alloy. Preferably, pressure plate 420 is made of substantially the same material as antenna honeycomb 404 (FIG. 4A) to have matched thermal characteristics. Backplate 1302 may be attached to faceplate 1304 in any suitable manner, such as, for example, dip brazing, vacuum brazing or laser welding.

Backplate 1302 includes rectangular cutouts 1306A–1306C. Faceplate 1304 includes rectangular cutouts 1308A–1308C. When backplate 1302 and faceplate 1304 are attached together, cutouts 1306A–1306C and 1308A–1308C are registered together, forming openings through which EBSC circuits 436A–436C (FIG. 4B) are accessible when pressure plate 420 is attached to multilayer wiring board 416 (FIG. 4B).

Faceplate 1304 also includes waveguide recesses 1311–1316, which are formed in faceplate 1304 approximately 0.188 inches deep and 0.622 inches wide. Each of recesses 1311–1316 are machined in faceplate 1304 to be approximately 21.20 inches in length, ±0.010 inches. When backplate 1302 is attached to faceplate 1304, waveguide recesses 1311–1316 and backplate 1304 form waveguides 430 (FIG. 4C) that include individual rectangular waveguides 1321–1326 having a width and height of approximately 0.188 and 0.622 inches, respectively.

In an alternative embodiment, backplate 1302 may be deleted. Instead, plates shaped to fit waveguide recesses 1311–1316 may be welded to faceplate 1304, thereby forming rectangular waveguides 430 (FIG. 4C) in plate 420 that include individual waveguides 1321–1326. In this embodiment, the depth of recesses 1311–1316 allow for the thickness of the shaped plates so that waveguides 1321–1326 have a width and height of approximately 0.188 and 0.622 inches, respectively.

Figure 14:
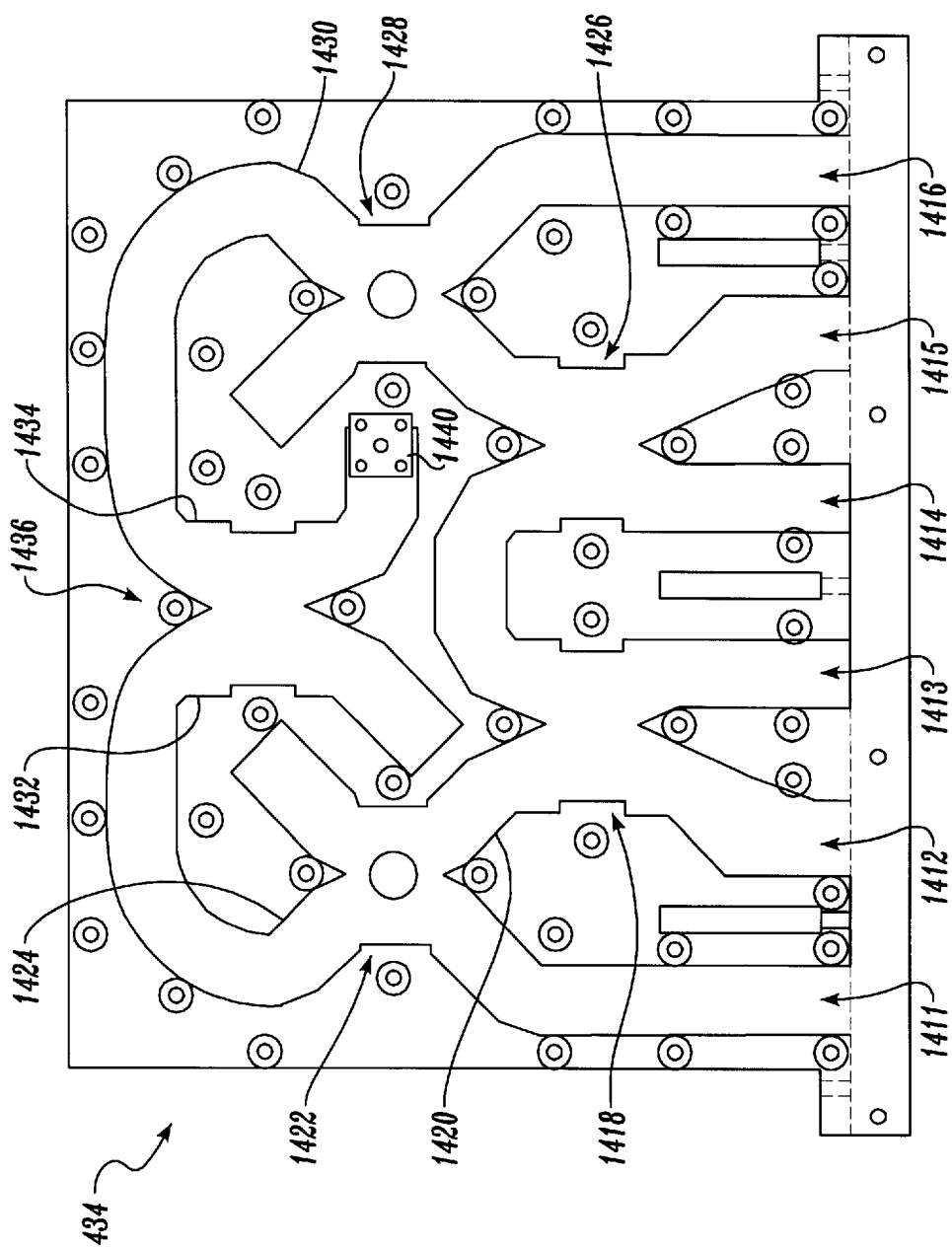
FIG. 14 is a transverse section of a waveguide combiner according to one embodiment of the present invention.

FIG. 14 shows a transverse section of one embodiment of waveguide combiner 434. Waveguide combiner 434 includes six input arms 1411–1416 that are respectively connected to waveguides 1321–1326 (FIG. 13). Input arms 1411–1416 are rectangular waveguides formed in waveguide combiner 434 with the substantially identical height and width as waveguides 1321–1326. Input arms 1412 and 1413 are connected to a two-way equal power combiner 1418. Equal power combiner 1418 combines the signals propagated by input arms 1412 and 1413 from waveguides 1322 and 1323 (FIG. 13) and outputs the combined signals through sum arm 1420. Sum arm 1420 is connected to the ⅔ arm of a two-way ⅓, ⅔-power combiner 1422. Input arm 1411 is connected to the ⅓ arm of ⅓, ⅔-power combiner 1422. The sum arm 1424 of ⅓, ⅔-power combiner 1422 outputs the combined signals received from waveguides 1321–1323 of pressure plate 420 (FIG. 13). Equal power combiners and ⅓, ⅔-power combiners are well known in the art of phased array antennas.

In a symmetrical manner, input arms 1414–1416 are coupled to a two-way equal power combiner 1426 and a two-way ⅓, ⅔-power combiner 1428 so that the sum arm 1430 of ⅓, ⅔-power combiner 1428 outputs the combined signals received from waveguides 1324–1326 of pressure plate 420 (FIG. 13).

Sum arms 1424 and 1430 are respectively connected to input arms 1432 and 1434 of two-way equal power combiner 1436. Thus, the sum arm 1438 of equal power combiner 1436 outputs the combined signals received from waveguides 1321–1326 (FIG. 13). Sum arm 1438 is connected to a waveguide-to-coaxial coupler 1440 (shown diagrammatically), which is coupled to LNB 306 (FIG. 3B) through coaxial cable 308 (FIG. 3B). Waveguide-to-coaxial coupler 1440 is substantially similar to the coaxial-to-waveguide transition described in conjunction with FIG. 11B, except that waveguide-to-coaxial coupler 1440 includes a standard coaxial cable connector for connecting to coaxial cable 308 (FIG. 3B). Alternatively, a true time delay network can be used instead of waveguide combiner 434.

Figure 15:
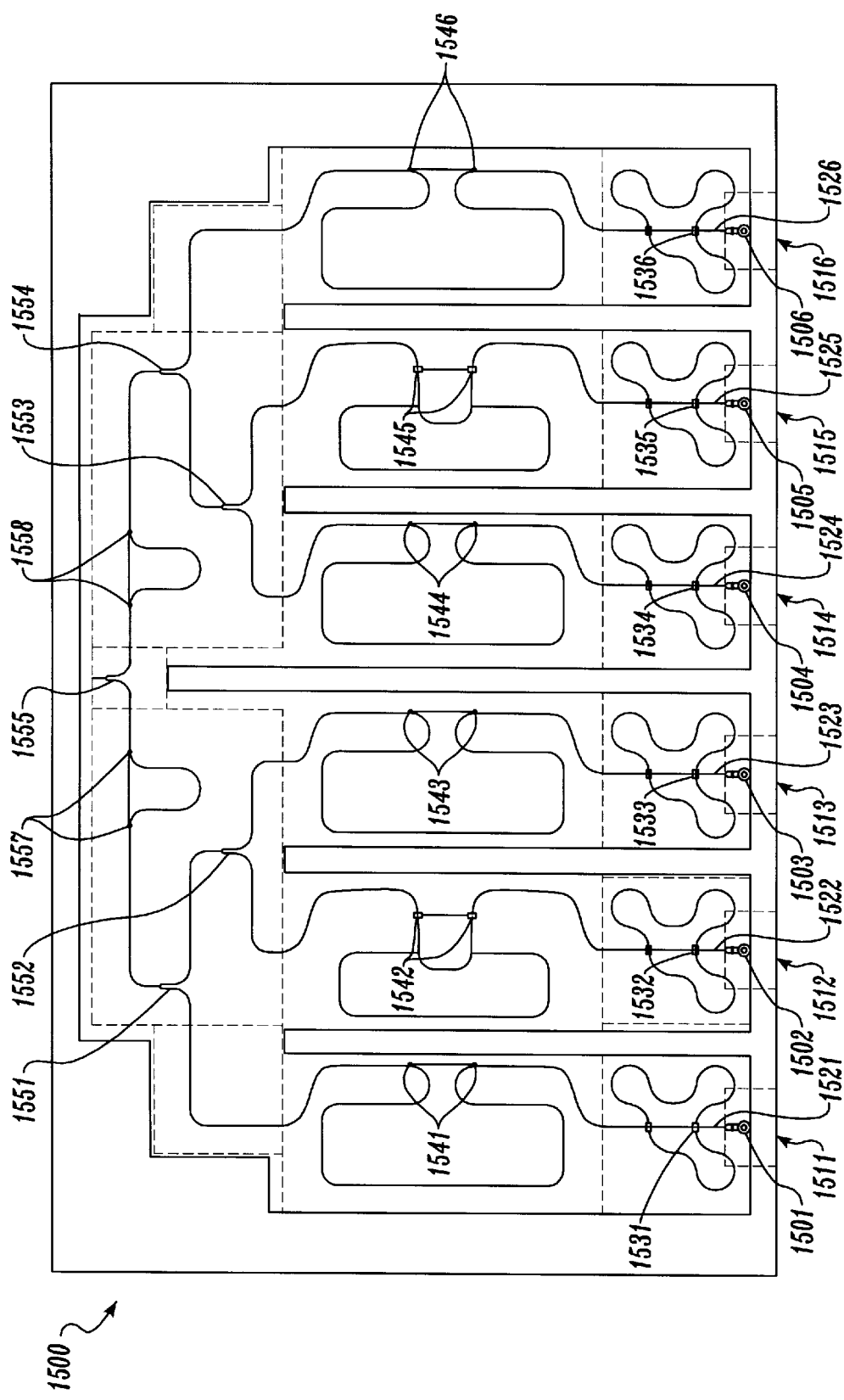
FIG. 15 is a top plan of a true time delay network according to one embodiment of the present invention.

FIG. 15 shows a diagram of a true time delay network (TTD) 1500 according to one embodiment of the present invention. TTD 1500 includes waveguide-to-coaxial couplers 1501–1506, respectively connected to corresponding waveguide sections 1511–1516. Waveguide sections 1511–1516 are respectively connected to waveguides 1321–1326 (FIG. 13). The coaxial output leads of waveguide-to-coaxial couplers 1501–1506 are respectively connected to the first ends of corresponding microstrip lines 1521–1526. As a result, microstrip lines 1521–1526 respectively conduct the signals propagated by waveguides 1321–1326 (FIG. 13). The second ends of microstrip lines 1521–1526 are respectively connected to microstrip switches 1531–1536. Microstrip switches 1531–1536 are selectably configured by controller 305 (FIG. 3B) to select one of three microstrip lines connected to each microstrip switch. The lengths and, thus, the delay, of each these three other microstrip lines are different. Thus, the delay introduced by microstrip switches 1531–1536 can be selected by controller 305 (FIG. 3B).

The output leads of switches 1531–1536 are respectively connected to additional microstrip switches 1541–1546. Switches 1541, 1543, 1544 and 1546 select between two microstrip lines of differing lengths, whereas switches 1542 and 1545 select between three microstrip lines of differing lengths. These switches provide further control of the relative delay introduced into each signal received from waveguides 1321–1326. The microstrip lines corresponding to waveguide 1321–1326 are then combined using power combiners 1551–1554, which in this embodiment are Wilkinson power combiners.

More specifically, the output leads of microstrip switches 1542 and 1543 are connected to the input leads of equal level power combiner 1552. The output leads of power combiner 1552 switch 1541 are connected to the input leads of ⅓, ⅔-power combiner 1551. Similarly, the output leads of switches 1544 and 1545 are connected to the input leads of equal level power combiner 1553, and the output leads of power combiner 1553 and switch 1546 are connected to the input leads of ⅓, ⅔-power combiner 1554. The output leads of equal level power combiners 1551 and 1554 are coupled to the input leads of power combiner 1555 through microstrip switches 1557 and 1558, which select between two microstrip lines of differing lengths. As a result, controller 305 (FIG. 3B) can adjust the relative delay of each signal from the six apertures associated with the six waveguides 1321–1326 (FIG. 13) to more accurately align the time delay to each of the apertures, thereby significantly increasing the instantaneous bandwidth of the resulting antenna when steered off broadside.

Figure 16:
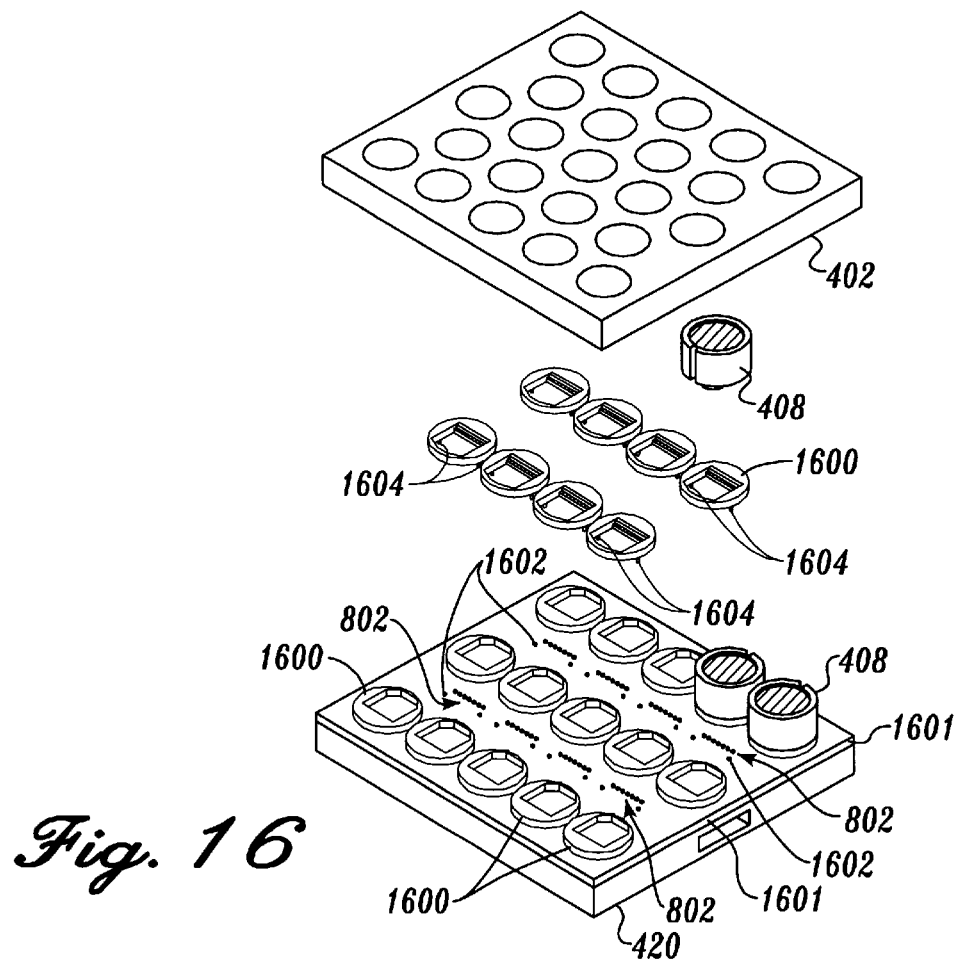
FIG. 16 is an exploded perspective of another embodiment of a phased array antenna using sockets to couple electronic modules to a multilayer wiring board, according to the present invention.

FIG. 16 is an exploded perspective of an alternative embodiment of a phased array antenna using sockets 1600 to couple electronic modules 408 to multilayer wiring board 1601 in a surface mount configuration. In the embodiment shown, electronic modules 408 are pressed against the multilayer wiring board with resilient sleeves. In other embodiments, springs can replace the sleeves. Multilayer wiring board 1601 is substantially similar to multilayer wiring board 416 (FIG. 4A) except that multilayer wiring board 1601 includes alignment holes 1602 for alignment pins on sockets 1600 instead of the cutouts or openings 418 (FIG. 4A) in multilayer wiring board 416. In addition, contacts 802 are located at the top surface of multilayer wiring board 1601 instead of an intermediate layer as in multilayer wiring board 416.

Each socket 1600 includes two alignment pins 1604 extending from its bottom surface. Alignment pins 1604 fit into alignment holes 1602 in multilayer wiring board 1601, whereby each socket 1600 is aligned with a corresponding set of contacts 610. Sockets 1600 are held in place by compression when pressure plate 420 is attached to antenna honeycomb 402. Although alignment pins 1604 are located on the bottom surface of socket 1600 in the described embodiment, other embodiments have the alignment pins on the top surface of the socket, with alignment holes in the antenna honeycomb.

Each socket 1600 also includes fuzz button contact elements (described further below in conjunction with FIGS. 17A and 17B) to make electrical contact with contacts 802 of multilayer wiring board 1601 and with contacts 610 of electronic modules 408. Thus, sockets 1600 and fuzz button contact elements provide conduction paths between electronic modules 408 and multilayer wiring board 1601 in a nonplanar configuration as opposed to the planar propagation paths provided by cutouts 418 and elastomeric connectors between the electronic modules and multilayer wiring board 416 (FIG. 4A).

Sockets 1600 eliminate the cutouts in multilayer wiring board 1601, thereby improving the manufacturability of and decreasing the complexity and cost of multilayer wiring board 1601, relative to multilayer wiring board 416 (FIG. 4A). However, sockets 1600 cause nonplanar propagation paths for the RF signals conducted between electronic modules 408 and multilayer wiring board 1601, as opposed to the planar propagation path between electronic modules 408 and multilayer wiring board 416 (FIG. 4A). The nonplanar propagation paths are more complex and may require shielding to achieve isolation between electronic modules.

Figures 17A, 17B:
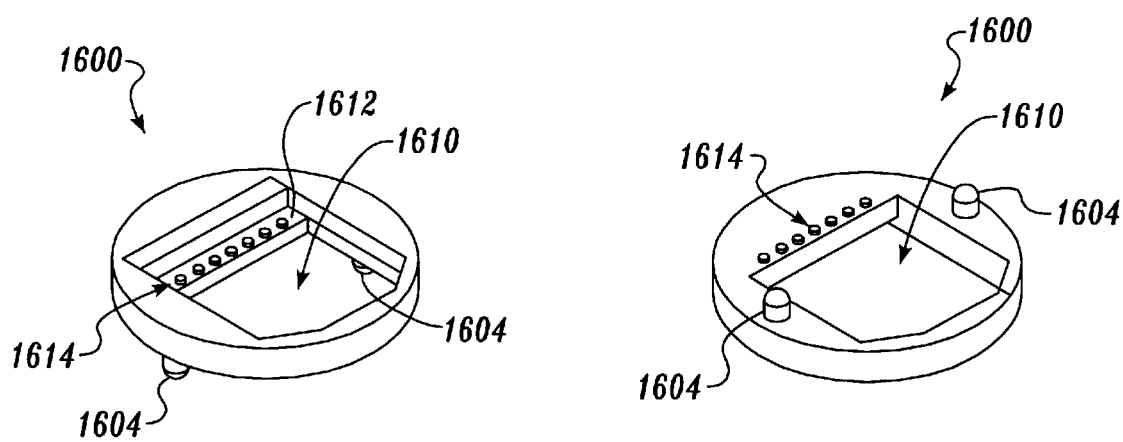
FIGS. 17A and 17B are top and bottom perspectives, respectively, of one embodiment of a socket according to the present invention.

FIGS. 17A and 17B are top and bottom perspectives, respectively, of one embodiment of a socket 1600. Socket 1600 includes a cutout 1610, keyed to semiconductor package 412 (FIG. 6E). Cutout 1610 has a ledge 1612 that is approximately flush with contacts 610 of semiconductor package 412 (FIG. 6E) when an electronic module 408 is fitted to socket 1600. Fuzz button contact elements 1614 are exposed on ledge 1612 to make electrical contact with contacts 610. In addition, as seen in FIG. 17B, fuzz button contact elements 1614 extend through ledge 1612 and make physical contact with contacts 802 of multilayer wiring board 1601 (FIG. 16) when socket 1600 is fitted to multilayer wiring board 1601. Fuzz buttons contact elements are, in general, gold plated resilient knitted wire mesh retained in a cup or attached to a threaded stud. Fuzz buttons contact elements are commercially available from Tecknit, Cranford, N.J. and Cinch Connector Division, Elk Grove Village, Ill. The fuzz button contact element may be replaced by an elastomeric connector inserted in the socket.

Although elastomeric and fuzz button connectors are described in the embodiments above, any type of compliant connector may be used. As used herein, "compliant connectors" refer to connectors that include a resilient material that can be compressed to facilitate and maintain good electrical contact between conductors of the compliant connector and contacts to be electrically connected. The resilient material may be a backing as in the elastomeric connectors described above or in the conductors of the connector as in the fuzz button connectors described above, or any combination of resilient backing and resilient conductors.

The embodiments of the invention described above are illustrative of the principles of the invention and are not intended to limit the invention to the particular embodiments described. For example, in other embodiments, other types of connectors can be used instead of the elastomeric and fuzz button connectors described. Other embodiments may use striplines in the TDD instead of microstrips. Further, in other embodiments, the phased-array antenna may be used in applications other than DBS applications, or in applications using EM signals that are not circularly polarized. Accordingly, while the preferred embodiment of the invention has been illustrated and described, it will be appreciated that various changes can be made therein without departing from the spirit and scope of the invention.

The embodiments of the invention in which an exclusive property or privilege is claimed are defined as follows:

1. A phased-array antenna structure comprising:
   an antenna waveguide structure including a plurality of waveguides, said antenna waveguide structure being configured to propagate electromagnetic (EM) signals within said plurality of waveguides;
   a plurality of electronic modules, each electronic module of said plurality of electronic modules being coupled to a corresponding waveguide of said plurality of waveguides of said antenna waveguide structure, wherein each electronic module of said plurality of electronic modules is configured to adjust a phase of an EM signal received by the electronic module; and
   a multilayer wiring board discrete from and coupled to said plurality of electronic modules, said multilayer wiring board including EM signal propagation paths intercoupled between said plurality of electronic modules, wherein said EM signal propagation paths are configured to propagate a signal corresponding to an EM signal propagated in a waveguide of said plurality of waveguides of said antenna waveguide structure.

2. The phased-array antenna structure of claim 1 wherein each electronic module of said plurality of electronic modules is configured to adjust the phase of said EM signal received by the electronic module from said corresponding waveguide of said plurality of waveguides of said antenna waveguide structure.

3. The phased-array antenna structure of claim 2 wherein said EM signal propagation paths of said multilayer wiring board are configured to distribute a radio frequency signal to said plurality of electronic modules.

4. The phased-array antenna structure of claim 1 wherein each electronic module of said plurality of electronic modules is configured to adjust the phase of said EM signal received by the electronic module from said EM signal propagation paths of said multilayer wiring board, and to provide the phase-adjusted EM signal to said corresponding waveguide of said plurality of waveguides of said antenna waveguide structure.

5. The phased-array antenna structure of claim 4 wherein said EM signal propagation paths of said multilayer wiring board include a plurality of EM couplers, the EM signal propagation paths being capable of collecting radio frequency signals from said plurality of electronic modules.

6. The phased-array antenna structure of claim 1 wherein said multilayer wiring board further includes digital signal propagation paths coupled to said plurality of electronic modules.

7. The phased-array antenna structure of claim 1 further comprising a plate coupled to said multilayer wiring board and said antenna waveguide structure with fasteners, said fasteners securing said antenna waveguide structure, said plurality of electronic modules, said multilayer wiring board and said plate together, wherein said fasteners permit facile assembly and disassembly of said antenna waveguide structure, said plurality of electronic modules, said multilayer wiring board and said plate as a unit.

8. The phased-array antenna structure of claim 7 wherein said plate includes a waveguide, said waveguide of said plate being configured to provide an EM signal propagation path to at least one of said EM signal propagation paths of said multilayer wiring board.

9. The phased-array antenna structure of claim 8 further comprising a waveguide combiner coupled to said waveguide of said plate.

10. The phased-array antenna structure of claim 8 further comprising a stripline-to-waveguide coupler coupled to said multilayer wiring board and said plate.

11. The phased-array antenna structure of claim 10 wherein said stripline-to-waveguide coupler comprises a coaxial transmission line.

12. The phased-array antenna structure of claim 1 wherein said EM signal propagation paths of said multilayer wiring board comprise a stripline.

13. The phased-array antenna structure of claim 1 further comprising a plurality of compliant connectors, wherein each compliant connector of said plurality of compliant connectors is configured to couple an electronic module of said plurality of electronic modules to a corresponding EM signal propagation path of said multilayer wiring board.

14. The phased-array antenna structure of claim 13 wherein said compliant connector comprises an elastomeric connector.

15. The phased-array antenna structure of claim 13 wherein said compliant connector comprises a fuzz button connector.

16. The phased-array antenna structure of claim 1 further comprising a plurality of sockets, each said socket of said plurality of sockets being configured to couple an electronic module of said plurality of electronic modules to a corresponding EM signal propagation path of said multilayer wiring board.

17. The phased-array antenna structure of claim 1 wherein each electronic module of said plurality of electronic modules comprises:
   a first EM signal probe;
   a second EM signal probe;
   a first amplifier coupled to said first EM signal probe;
   a second amplifier coupled to said second EM signal probe; and
   a phase shifter coupled to said first amplifier.

18. The phased-array antenna structure of claim 17 wherein said phase shifter is coupled to said second amplifier.

19. The phased-array antenna structure of claim 17 further comprising a quadrature network coupled to said first amplifier, said second amplifier and said phase shifter, said first amplifier coupled to said phase shifter through said quadrature network, wherein said quadrature network is capable of introducing an approximately 90° phase difference between a signal that is propagated on said first probe and a second signal that is propagated on said second probe.

20. The phased-array antenna structure of claim 19 wherein said quadrature network introduces said approximately 90° phase difference after said signals are propagated on said first probe and said second probe.

21. The phased-array antenna structure of claim 19 wherein said quadrature network introduces said approximately 90° phase difference before said signals are propagated on said first probe and said second probe.

22. The phased-array antenna structure of claim 21 further comprising a polarity switch coupled to said quadrature network and said phase shifter, said quadrature network coupled to said phase shifter through said polarity switch.

23. The phased-array antenna structure of claim 17 wherein each said electronic module of said plurality of electronic modules has said first and second amplifiers and said phase shifters mounted on a single substrate, said substrate disposed normally to a direction of EM signal propagation in said corresponding waveguide of said plurality of waveguides of said antenna waveguide structure.

24. The phased-array antenna structure of claim 17 wherein each electronic module of said plurality of electronic modules further comprises a waveguide in operative position with said first and second EM signal probes.

25. The phased-array antenna structure of claim 24 further comprising a coaxial transmission line, wherein said first EM signal probe is coupled to said first amplifier through said coaxial transmission line.

26. The phased-array antenna structure of claim 17 wherein said plurality of electronic modules can be selectably configured to propagate left-hand circularly polarized signals or right-hand circularly polarized signals.

27. A phased-array antenna structure comprising:
an antenna waveguide structure including a plurality of waveguides, said antenna waveguide structure being capable of propagating electromagnetic (EM) signals within said plurality of waveguides;
a plurality of electronic modules, each electronic module of said plurality of electronic modules being in operative position with a corresponding waveguide of said plurality of waveguides of said antenna waveguide structure, wherein each electronic module of said plurality of electronic modules comprises,
a first EM signal probe;
a second EM signal probe;
a first amplifier coupled to said first EM signal probe;
a second amplifier coupled to said second EM signal probe; and
a phase shifter coupled to said first amplifier; and
an interconnect structure coupled to said plurality of electronic modules, wherein said interconnect structure includes conductive paths configured to provide power and control signals to said plurality of electronic modules and conductive paths coupled between electronic modules of said plurality of electronic modules and configured to propagate EM signals corresponding to EM signals that are propagated in waveguides of said antenna waveguide structure.

28. The phased-array antenna structure of claim 27 wherein said phase shifter of each electronic module of said plurality of electronic modules is configured to shift a phase of an EM signal corresponding to an EM signal that is received from said corresponding waveguide of said plurality of waveguides of said antenna waveguide structure.

29. The phased-array antenna structure of claim 27 wherein said phase shifter of each electronic module of said plurality of electronic modules is configured to shift a phase of an EM signal received from a conductive path of said interconnect structure, the electronic module being configured to output the phase adjusted EM signal to said corresponding waveguide of said plurality of waveguides of said antenna waveguide structure.

30. The phased-array antenna structure of claim 27 wherein said plurality of electronic modules can be selectably configured to propagate left-hand circularly polarized signals or right-hand circularly polarized signals.

31. The phased-array antenna structure of claim 27 wherein said phase shifter is coupled to said second amplifier.

32. The phased-array antenna structure of claim 27 further comprising a quadrature network coupled to said first amplifier, said second amplifier and said phase shifter, said first amplifier coupled to said phase shifter through said quadrature network, wherein said quadrature network is capable of introducing an approximately 90° phase difference between a signal that is propagated on said first probe and a second signal that is propagated on said second probe.

33. The phased-array antenna structure of claim 27 wherein said quadrature network introduces said approximately 90° phase difference after said signals are propagated on said first probe and said second probe.

34. The phased-array antenna structure of claim 27 wherein each said electronic module of said plurality of electronic modules has said first and second amplifiers and said phase shifters mounted on a single substrate, said substrate disposed normal to a direction of EM signal propagation in said corresponding waveguide of said plurality of waveguides of said antenna waveguide structure.

35. The phased-array antenna structure of claim 27 wherein each electronic module of said plurality of electronic modules comprises first and second coaxial transmission lines that are configured to couple said first and second EM signal probes to said first and second amplifiers, respectively.

36. The phased-array antenna structure of claim 27 wherein said active phased-array antenna operates at a frequency band of about 6 GHz to about 45 GHz.

37. The phased-array antenna structure of claim 27 wherein each electronic module of said plurality of electronic modules further comprises a waveguide in operative position with said first and second EM signal probes.

38. The phased-array antenna structure of claim 37 wherein said waveguide of each electronic module of said plurality of electronic modules comprises a T0-8 transistor package, said substrate being mounted on a header of said T0-8 transistor package.

39. The phased-array antenna structure of claim 27 further comprising a stripline-to-waveguide coupler coupled to said interconnect structure.

40. The phased-array antenna structure of claim 39 wherein said stripline-to-waveguide coupler comprises a coaxial transmission line.

41. The phased-array antenna structure of claim 27 wherein said interconnect structure comprises a multilayer wiring board with a plurality of striplines intercoupling said plurality of electronic modules.

42. An individual electronic module for use in an active phased-array antenna, said individual module comprising:
a waveguide having a discrete wave receiving passage;
a first electromagnetic (EM) signal probe disposed within said waveguide passage;
a second EM signal probe disposed within the same waveguide passage as said first EM signal probe;
a first amplifier coupled to said first EM signal probe;
a second amplifier, separate from said first amplifier, coupled to said second EM signal probe; and
a phase shifter coupled to said first amplifier.

43. The electronic module of claim 42 wherein said phase shifter is coupled to said second amplifier.

44. The electronic module of claim 42 further comprising a quadrature network coupled to said first amplifier, said second amplifier and said phase shifter, said first amplifier coupled to said phase shifter through said quadrature network, wherein said quadrature network is capable of introducing an approximately 90° phase difference between a signal that is propagated on said first probe and a second signal that is propagated on said second probe.

45. The electronic module of claim 42 wherein said quadrature network introduces said approximately 90° phase difference after said signals are propagated on said first probe and said second probe.

46. The electronic module of claim 42 wherein said electronic module has said first and second amplifiers and said phase shifters mounted on a single substrate, said substrate disposed normal to a direction of EM signal propagation in said corresponding waveguide of said plurality of waveguides of said antenna waveguide structure.

47. The electronic module of claim 42 further comprising a coaxial transmission line, wherein said first EM signal probe is coupled to said first amplifier through said coaxial transmission line.

48. The electronic module of claim 42 wherein said electronic module is capable of operating at a frequency between about 6 GHz to about 45 GHz.

49. The electronic module of claim 42 wherein said electronic further comprises a waveguide in operative position with said first and second EM signal probes.

50. The electronic module of claim 49 wherein said waveguide of said electronic module comprises a T0-8 transistor package.

51. A phased-array antenna structure comprising:
an antenna waveguide structure including a first waveguide and a second waveguide, said antenna structure capable of propagating electromagnetic (EM) signals within said first waveguide and said second waveguide;
a first electronic module coupled to said first waveguide of said antenna waveguide structure, wherein said first electronic module is configured to adjust a phase of a first EM signal that is received from said first waveguide of said antenna waveguide structure;
a second electronic module coupled to said second waveguide of said antenna waveguide structure, wherein said second electronic module is configured to adjust a phase of a second EM signal that is received from said second waveguide of said antenna waveguide structure; and
a multilayer wiring board coupled to said first electronic module and said second electronic module, said multilayer wiring board including a first EM signal propagation path coupled to said first electronic module and a second EM signal propagation path, said second EM propagation path being coupled to said second electronic module, wherein said first EM signal propagation path is capable of propagating a first signal corresponding to said first EM signal propagated in said first waveguide of said antenna waveguide structure and wherein said second EM signal propagation path is capable of propagating a second signal corresponding to said second EM signal propagated in said second waveguide of said antenna waveguide structure.

52. The phased-array antenna structure of claim 51 wherein each electronic module of said plurality of electronic modules comprises:
first EM signal probe;
a second EM signal probe;
a first amplifier coupled to said first EM signal probe;
a second amplifier coupled to said second EM signal probe; and
a phase shifter coupled to said first amplifier.

53. The phased-array antenna structure of claim 51, wherein said plurality of electronic modules are detachably coupled to said multilayer wiring board.

54. The phased-array antenna structure of claim 51, wherein said plurality of electronic modules are disposed between said antenna waveguide structure and said multilayer wiring board and held in place by a compressive force between said antenna waveguide structure and said multilayer wiring board.

55. The phase-array antenna structure of claim 51, wherein said multilayer wiring board comprises a combiner coupling the first and second EM signal propagation paths.

56. The phased-array antenna structure of claim 55, wherein the first and second EM propagation paths each comprise a stripline oriented to be parallel to a plane containing said multilayer wiring board.

57. The phased-array antenna structure of claim 55, wherein the combiner comprises a Wilkinson combiner.

* * * * *

UNITED STATES PATENT AND TRADEMARK OFFICE
CERTIFICATE OF CORRECTION

PATENT NO. : 5,886,671
DATED : March 23, 1999
INVENTOR(S) : D.E. Riemer et al.

It is certified that error appears in the above-identified patent and that said Letters Patent is hereby corrected as shown below:

| COLUMN | LINE | ERROR |
|---|---|---|
| [56] Pg. 2, col. 2 | Refs. Cited (Other Publs., item 8) | "Antennas ",*Proceedings*" should read --Antennas", *Proceedings*-- |
| [56] Pg. 2, col. 2 | Refs. Cited (Other Publs., item 8) | "25,1992)." should read --25, 1992).-- |
| 23 (Claim 27, | 29 line 12) | After "probe" delete ";" and insert therefor --,-- |
| 23 (Claim 27, | 30 line 13) | After "probe" delete ";" and insert therefor --,-- |
| 23 (Claim 27, | 31 line 14) | After "probe" delete ";" and insert therefor --,-- |
| 23 (Claim 27, | 33 line 16) | After "probe" delete ";" and insert therefor --,-- |
| 25 (Claim 49, | 17 line 2) | After "electronic" insert --module-- |

UNITED STATES PATENT AND TRADEMARK OFFICE
CERTIFICATE OF CORRECTION

PATENT NO. : 5,886,671
DATED : March 23, 1999
INVENTOR(S) : D.E. Riemer et al.

It is certified that error appears in the above-identified patent and that said Letters Patent is hereby corrected as shown below:

| COLUMN | LINE | ERROR |
|---|---|---|
| 26 (Claim 52, | 16 line 4) | "first" should read --a first-- |

Signed and Sealed this

Twenty-fourth Day of August, 1999

Attest:

Q. TODD DICKINSON

*Attesting Officer*    *Acting Commissioner of Patents and Trademarks*